(12) United States Patent
Wolff

(10) Patent No.: US 11,143,697 B2
(45) Date of Patent: Oct. 12, 2021

(54) AUTOMATED HANDLING OF DIFFERENT FORM FACTOR DEVICES UNDER TEST IN TEST CELL

(71) Applicant: Advantest Corporation, Tokyo (JP)

(72) Inventor: Roland Wolff, San Jose, CA (US)

(73) Assignee: ADVANTEST CORPORATION, Tokyo (JP)

(*) Notice: Subject to any disclaimer, the term of this patent is extended or adjusted under 35 U.S.C. 154(b) by 1083 days.

(21) Appl. No.: 15/581,361

(22) Filed: Apr. 28, 2017

(65) Prior Publication Data

US 2018/0313890 A1    Nov. 1, 2018

(51) Int. Cl.
*G01R 31/28* (2006.01)
*B25J 9/16* (2006.01)

(52) U.S. Cl.
CPC ........ *G01R 31/2834* (2013.01); *B25J 9/1697* (2013.01); *G01R 31/2868* (2013.01); *G01R 31/2893* (2013.01); *G01R 31/2891* (2013.01); *G05B 2219/45063* (2013.01)

(58) Field of Classification Search
CPC ............ G01R 31/2832; G01R 31/2834; G01R 31/286; G01R 31/2868; G01R 31/2893; B25J 9/1697
See application file for complete search history.

(56) References Cited

U.S. PATENT DOCUMENTS

| | | | |
|---|---|---|---|
| 5,510,993 A | 4/1996 | Williams et al. | |
| 5,588,797 A * | 12/1996 | Smith | G01R 31/01 414/416.01 |
| 6,067,866 A | 5/2000 | Krajec et al. | |
| 6,327,687 B1 * | 12/2001 | Rajski | G01R 31/318335 714/738 |
| 6,794,887 B1 | 9/2004 | Nelson et al. | |
| 6,974,335 B1 | 12/2005 | Podpora | |
| 7,046,027 B2 | 5/2006 | Conner | |
| 7,084,659 B2 | 8/2006 | Delucco et al. | |
| 7,443,184 B2 | 10/2008 | Norris | |
| 7,532,023 B2 | 5/2009 | Norris | |
| 7,649,374 B2 | 1/2010 | Fishman et al. | |
| 7,810,006 B2 | 10/2010 | Yao et al. | |
| 7,848,106 B2 | 12/2010 | Merrow | |
| 8,102,173 B2 | 1/2012 | Merrow | |
| 8,117,480 B2 | 2/2012 | Merrow et al. | |
| 8,350,191 B2 | 1/2013 | Ondricek | |
| 2004/0225408 A1 * | 11/2004 | Whitcomb | H01L 21/67265 700/213 |
| 2006/0005094 A1 * | 1/2006 | Nozuyama | G01R 31/31835 714/738 |
| 2007/0040569 A1 | 2/2007 | Gopal et al. | |

(Continued)

*Primary Examiner* — Huy Q Phan
*Assistant Examiner* — David B Frederiksen

(57) ABSTRACT

A system for performing tests using automated test equipment (ATE) is disclosed. The system comprises a robot comprising an end effector operable to pick up and transfer a DUT in-and-out of a test slot in a primitive. The system further comprises a system controller comprising a memory and a processor for controlling the robot. Also, the system comprises a test rack comprising a plurality of primitives, wherein the primitive is a modular device comprising a plurality of slots for testing a plurality of DUTs, and wherein the robot is configured to access slots in the plurality of primitives within the test rack using the end effector.

27 Claims, 20 Drawing Sheets

(56) References Cited

U.S. PATENT DOCUMENTS

| | | |
|---|---|---|
| 2009/0262455 A1 | 10/2009 | Merrow |
| 2009/0265032 A1 | 10/2009 | Toscano et al. |
| 2014/0046613 A1* | 2/2014 | Roberts, Jr. ........ G01R 31/2601 702/108 |
| 2014/0070828 A1* | 3/2014 | Andberg ............ G01R 31/2893 324/750.02 |
| 2015/0028908 A1* | 1/2015 | Kushnick ............ G06F 11/2221 324/750.05 |
| 2015/0067422 A1* | 3/2015 | Hamilton ................ G06F 11/24 714/724 |
| 2015/0217451 A1* | 8/2015 | Harada .................. B25J 9/1697 700/253 |
| 2015/0355231 A1* | 12/2015 | Rogel-Favila ..... G01R 31/2801 324/750.13 |
| 2015/0355271 A1* | 12/2015 | Rogel-Favila ..... G01R 31/2874 324/750.08 |
| 2015/0377796 A1* | 12/2015 | Schlezinger ....... G01R 31/2648 356/72 |
| 2016/0059419 A1* | 3/2016 | Suzuki .................. B25J 9/1697 700/114 |
| 2016/0339590 A1* | 11/2016 | Lin ...................... B25J 15/0061 |

\* cited by examiner

AUTOMATED HANDLING OF DIFFERENT FORM FACTOR DEVICES UNDER TEST IN TEST CELL

CROSS-REFERENCE TO RELATED APPLICATIONS

The present application is related to U.S. patent application Ser. No. 15/455,103, filed Mar. 9, 2017, entitled "DEVICE TESTING USING DUAL-FAN COOLING WITH AMBIENT AIR," naming Roland Wolff as inventor. That application is incorporated herein by reference in its entirety and for all purposes.

FIELD OF THE INVENTION

The present disclosure relates generally to the field of automated test equipment and more specifically to techniques of automated handling with respect to such equipment.

BACKGROUND OF THE INVENTION

Automated test equipment (ATE) can be any testing assembly that performs a test on a semiconductor wafer or die, an integrated circuit (IC), a circuit board, or a packaged device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

When a typical ATE system tests a device (commonly referred to as a device under test or DUT), the ATE system applies stimuli (e.g. electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure.

It is common for an ATE system to include a computer that directs the operation of the ATE system. Typically, the computer runs one or more specialized software programs to provide (i) a test development environment and (ii) a device testing environment. In the test development environment, a user typically creates a test program, i.e., a software-based construct of one or more files that controls various portions of the ATE system. In the device testing environment, the user typically provides the ATE system with one or more devices for testing, and directs the ATE system to test each device in accordance with the test program. The user can test additional devices by simply providing the additional devices to the ATE system, and directing the ATE system to test the additional devices in accordance with the test program. Accordingly, the ATE system enables the user to test many devices in a consistent and automated manner based on the test program.

In a typical prior art testing environment, the DUTs are placed into a controlled environmental chamber or "oven." The DUTs are connected to tester slices of a test head. Several DUTs can be connected to a single slice and a single testing chamber may contain several slices. The slices contain the test circuitry, which performs tests on the DUTs in accordance with a test plan. When in the oven, the DUTs are not user accessible as to not disturb the controlled environment of the chamber. When in the chamber, if some DUT testing ends early, you cannot remove them until all the testing is done. Then the chamber can be accessed.

One of the problems associated with this testing environment is that the inside of the environment chamber is not accessible during testing which results in certain tester slices being idle if tests are being run using the active tester slices in the oven. Another problem is that conventional testing environments typically require manual insertion and removal of DUTs from the tester slices, which is disadvantageous because it is time consuming, error prone and the DUTs can be damaged during the manual handling. Further, manual insertion and removal of DUTs in a volume production environment is significantly inefficient and error prone.

BRIEF SUMMARY OF THE INVENTION

Accordingly, a need exists for an automated method of handling different form factor DUTs in a test cell. Additionally, what is needed is an automated method of inserting DUTs into and removing DUTs from the primitives in a test head using robots that eliminates the need for human labor and achieves higher yield in less time. Further, what is needed is a test environment that allows access of the system while tests are running within the environment so that the system can be fully utilized. Using the beneficial aspects of the systems described, without their respective limitations, embodiments of the present invention provide a novel solution to address these problems.

The invention disclosed herein utilizes a plurality of primitives and associated DUT interface boards (DIBs) to test the DUTs. Each primitive is modular meaning that it is capable of operating independently from other primitives. Each primitive is connected to a DIB, wherein the DIB contains a plurality of slots for a plurality of DUTs.

Embodiments of the present invention utilize robots to automate the test process, in part, by automating the insertion of the DUTs into the DIBs and the removal of the DUTs from the DIBs. The robots, in one embodiment, utilize exchangeable grippers to handle DUTs of various form factors. The automated process can be programmed so that the robot recognizes which type of device is being tested automatically and chooses an appropriate gripper for the form factor of the device being tested. Further, in other embodiments, the tester can also be programmed so that the robots have the intelligence to also determine the orientation of the device in the bins (horizontal or vertical) and the placement of the device. In additional embodiments, the robot is further programmed with the intelligence to grab the device without damaging it by using cameras and external reference points.

In accordance with embodiments of the present invention, device heating is generally produced by the DUTs operating themselves. Therefore, after allowing the devices to operate, they will achieve a set point temperature. Cooling methods and systems, e.g., fans internal to the DIBs employed within the embodiments of the present invention then effectively cool the devices so that they maintain their set point temperature for testing. Therefore, a temperature controlled environmental chamber is not required to heat the devices. Other advantages are that ambient air can be used successfully to cool the DUTs without needing additional cooling elements, aside from the fans. Therefore, the need for an expensive environmental chamber is eliminated because testing can be performed in a lab setting or test floor. The solution is low cost and the DIB (DUT interface board) and test execution module (or primitive) combination lend themselves to robotic DUT manipulation and are therefore well suited for high volume testing of various electronic devices including, but not limited to, network cards, graphics cards, chips, microprocessors, hard disk drives (HDD), and solid state drives (SSD), etc.

In addition, since the DUTs are not located within an environmental testing chamber, they are more readily handled, physically manipulated, inspected, etc., during the testing cycles using robots. Aspects of the electronic circuitry used to test the DUTs are also modularized (using primitives, as described herein). Therefore, different modules can be performing different tests on different form factor and DUTs types or different tests on the same DUT type (because there is no more need for tests to run in lock step). This increases overall test efficiency and test flexibility.

In one embodiment, a method for performing tests using automated test equipment (ATE) is disclosed. The method comprises locating a device under test (DUT) to be tested. Further, it comprises recording a presence of the DUT in a database and querying the database to determine if an empty slot is present in a primitive, wherein the primitive is a modular device comprising a plurality of slots for receiving and testing a plurality of DUTs. The method also comprises using a robot to insert the DUT in the empty slot and reporting to the database that the empty slot has been filled. Finally, the method comprises initiating testing on the DUT.

In a different embodiment, a system for performing tests using automated test equipment (ATE) is presented. The system comprises a robot comprising an end effector operable to pick up and transfer a DUT in-and-out of a test slot in a primitive. The system further comprises a system controller comprising a memory and a processor for controlling the robot. Additionally, the system comprises a test rack comprising a plurality of primitives, wherein the primitive is a modular device comprising a plurality of slots for testing a plurality of DUTs, and wherein the robot is configured to access slots in the plurality of primitives within the test rack using the end effector.

In yet another embodiment, a system for performing tests using automated test equipment (ATE) is disclosed. The system comprises a robot comprising an end effector operable to pick up and transfer a DUT in-and-out of a test slot in a primitive. The system further comprises an input and output module comprising a plurality of trays and operable to present DUTs from the plurality of trays to the robot during testing. Additionally the system comprises a system controller comprising a memory and a processor for controlling the robot. Also, the system comprises a test rack comprising a plurality of primitives, wherein the primitive is a modular device comprising a plurality of slots for testing a plurality of DUTs, and wherein the robot is configured to access slots in the plurality of primitives within the test rack.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

Figure 1:
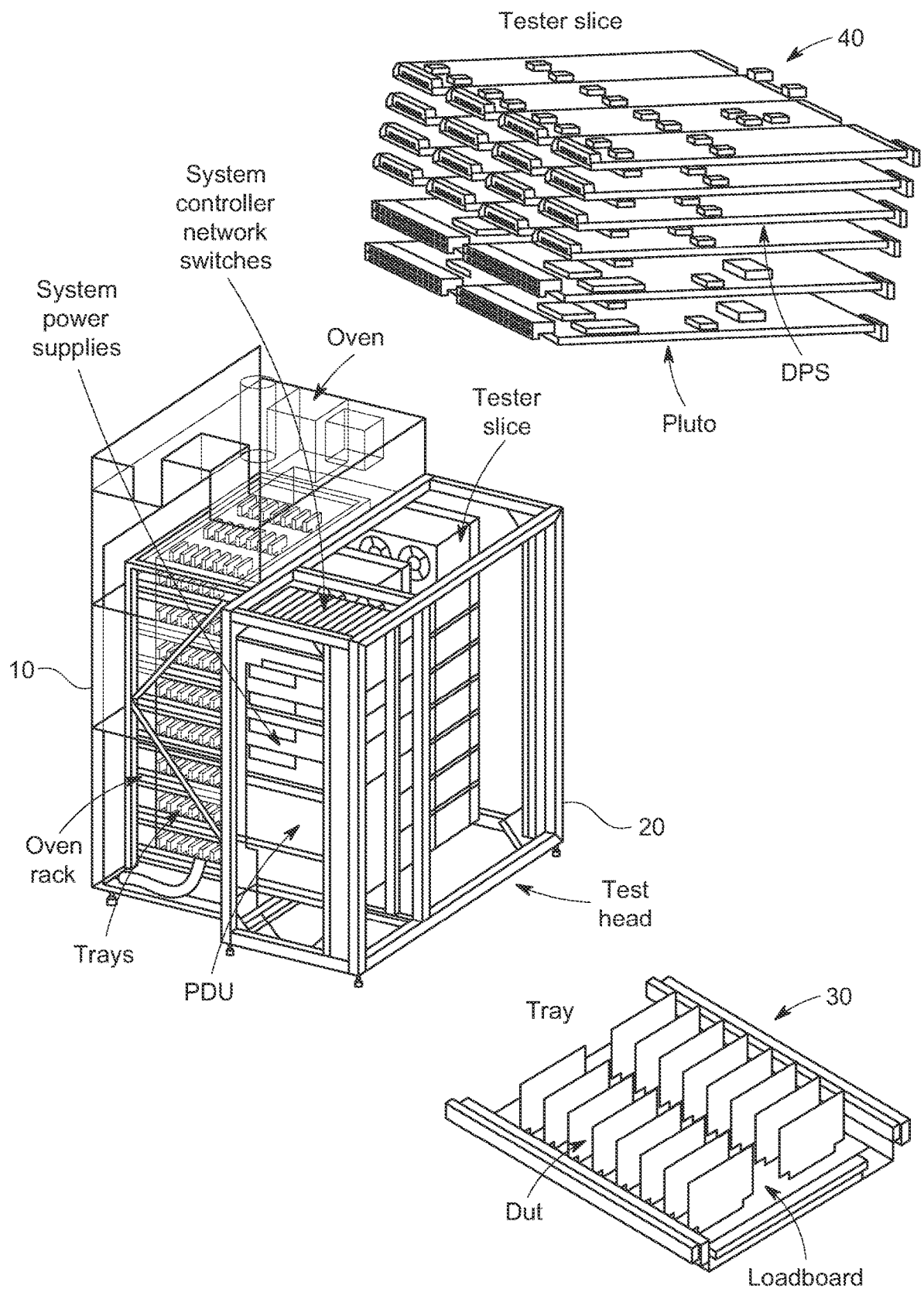
FIG. 1 illustrates a conventional testing environment in which DUTs are placed into a controlled environmental chamber.

In the figures, elements having the same designation have the same or similar function.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "configuring," "updating," "testing," "polling," or the like, refer to actions and processes (e.g., flowchart 1300 of FIG. 13) of a computer system or similar electronic computing device or processor. The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Automated Handling of Different Form Factor Devices Under Test in Test Cell

FIG. 1 illustrates a conventional testing environment in which DUTs are placed into a controlled environmental chamber 10 or "oven." The DUTs are connected to tester slices of a test head 20. Many DUTs can be connected to a single tester slice 40. The tester slices contain the test circuitry, which performs tests on the DUTs in accordance with a test plan. There can be many tester slices per test head 20. The DUTs are placed into trays 30 when inserted into the oven 10. When in the oven 10, the DUTs are typically not user accessible so as to not disturb the controlled environment of the chamber 10. In a typical environmental chamber, the plurality of tester slices operate in lock step executing the same test plan on the plurality of DUTs. Further, the test head is typically controlled by a single controller computer system (not shown) that is directly connected to the test head and, in this fashion, controls all of the slices of the test head 20.

One of the problems associated with this testing environment is that the inside of the environment chamber is not accessible during testing which results in entire tester slices or unoccupied slots in tester slices being idle if tests are being run using the other tester slices in the test head. Another problem is that conventional testing environments typically require manual insertion and removal of DUTs from the tester slices, which is disadvantageous because it is time consuming, error prone and the DUTs can be damaged during the manual handling. Further, manual insertion and removal of DUTs in a volume production environment is significantly inefficient.

Embodiments of the present invention provide an automated method of handling different form factor DUTs in a test cell. Embodiments of the present invention further provide an automated method of inserting DUTs into and removing DUTs from the primitives in a test head using robots, thereby, eliminating the need for human labor and achieving higher yield in less time. Further, embodiments of the present invention permit access of the inside of the chamber while tests are running within the chamber so that the chamber can be fully utilized at the same time.

In accordance with embodiments of the present invention, device heating is generally produced by the DUTs operating themselves. Therefore, after allowing the devices to operate, they will achieve a set point temperature. Cooling methods and systems, e.g., fans internal to the DIBs employed within the embodiments of the present invention then effectively cool the devices so that they maintain their set point temperature for testing. Therefore, a temperature controlled environmental chamber is not required to heat the devices.

Other advantages are that ambient air can be used successfully to cool the DUTs without needing additional cooling elements, aside from the fans. Therefore, the need for an expensive environmental chamber is eliminated. The solution is low cost and the DIB (DUT interface board) and test execution module (or primitive) combination lend themselves to robotic DUT manipulation and are therefore well suited for high volume testing of various electronic devices including, but not limited to, network cards, graphics cards, chips, microprocessors, hard disk drives (HDD), and solid state drives (SSD), etc.

In addition, since the DUTs are not located within an environmental testing chamber, they are more readily handled, physically manipulated, inspected, etc., during the testing cycles using robots. Aspects of the electronic circuitry used to test the DUTs are also modularized (using primitives, as described herein). Therefore, different modules can be performing different tests on different or even the same form factor and DUTs types. This increases overall test efficiency and test flexibility.

As indicated above, embodiments of the present invention advantageously utilize robots to automate the test process, in part, by automating the insertion of the DUTs into the DIBs and the removal of the DUTs from the DIBs. The robots, in one embodiment, utilize exchangeable grippers to handle DUTs of various form factors. The automated process can be programmed so that the robot has the intelligence, flexibility and strength to recognize which type of device is being tested automatically and chooses an appropriate gripper for the form factor of the device being tested. Further, in other embodiments, the tester can also be programmed so that the robots have the intelligence to also determine the orientation of the device in the bins (horizontal or vertical) and the placement of the device. In additional embodiments, the robot is further programmed with the intelligence to grab the device without damaging it by using cameras and external reference points.

Figure 2:
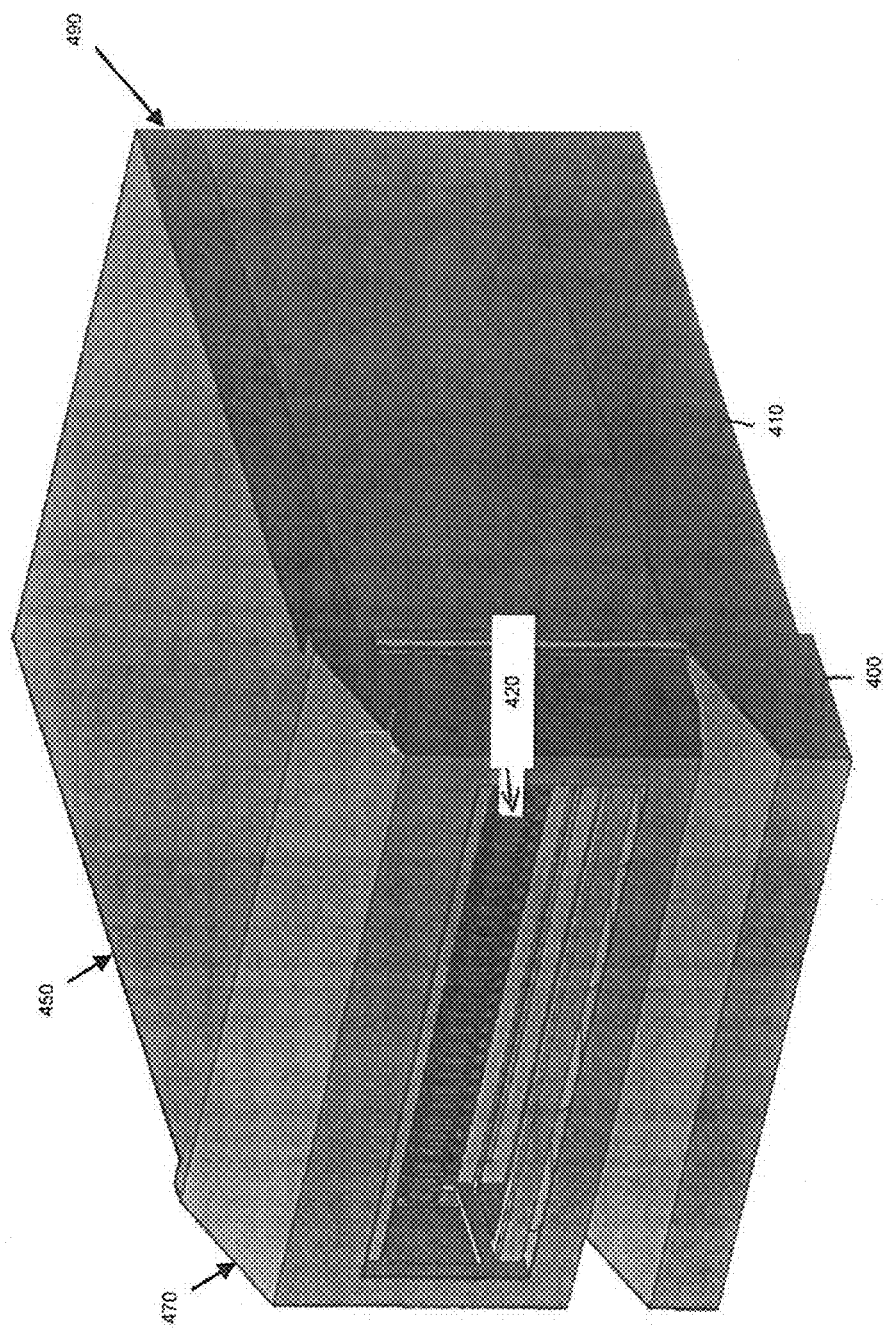
FIG. 2 illustrates a primitive interfaced with a DUT Interface Board (DIB) 400 in accordance with an embodiment of the invention.
Figure 4:
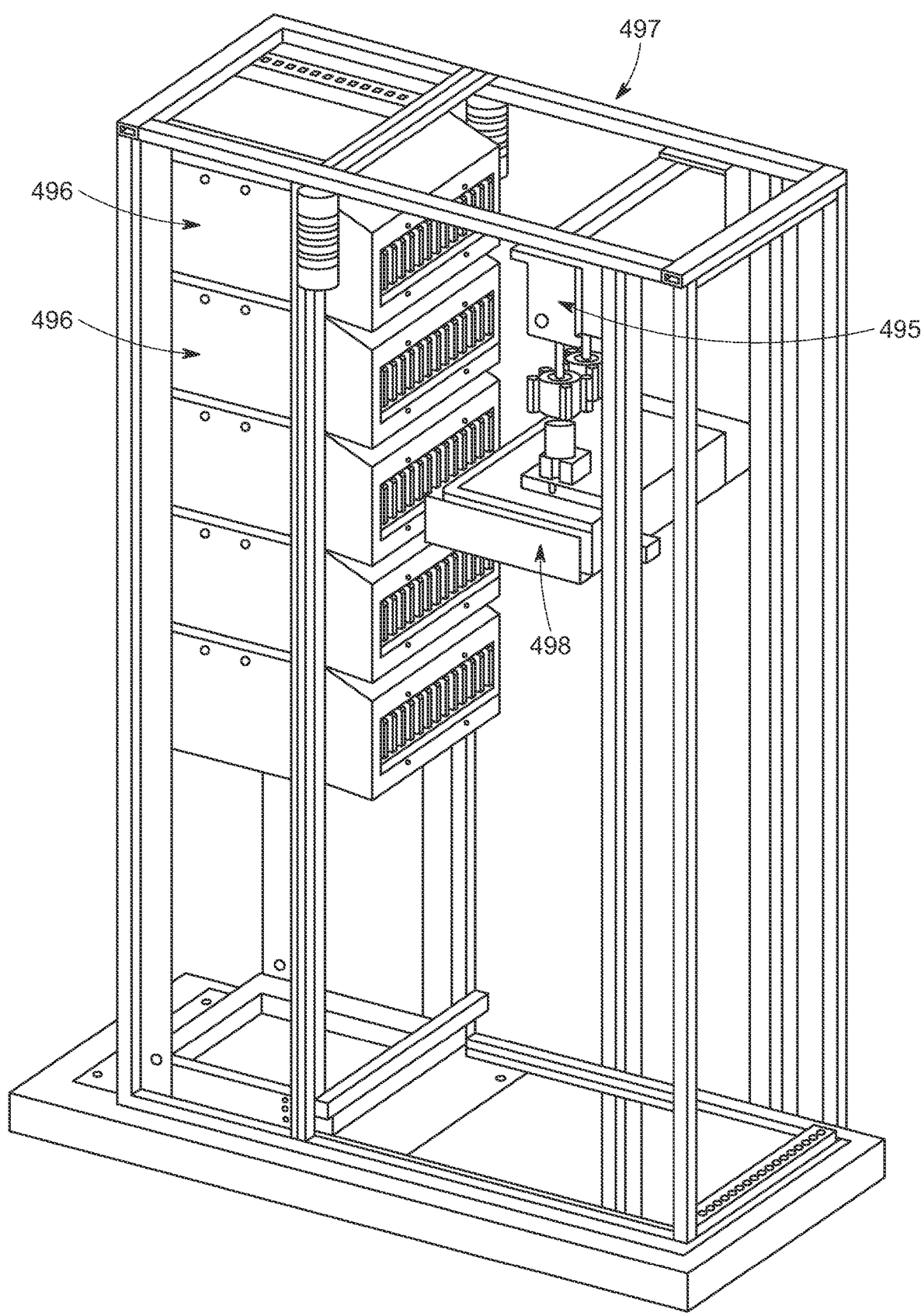
FIG. 4 illustrates an automated workcell using a Cartesian three-axes industrial robot used to transfer DUT devices (e.g., Solid State Drives) into and out of the test primitives in the test head in accordance with an embodiment of the present invention.

FIG. 2 illustrates a primitive 410 interfaced with a DUT Interface Board (DIB) 400 in accordance with an embodiment of the invention. Similar to the tester slice 40 shown in FIG. 2, the primitive of FIG. 4 is a type of discrete test module that fits into test head 20 and comprises the test circuitry, which performs tests on the DUTs in accordance with a test plan. A primitive is an improvement over the tester slice 40 of FIG. 1, in part, because it comprises an enclosure 450 within which all the various electronics e.g., site modules, power supplies, etc. are housed. The DIB 400 can contain a plurality of DUTs 420 using custom connectors sized for the DUTs 420. The DIB 400 can also comprise an enclosure 470. The DIB 400 interfaces to a universal backplane (not shown) of the primitive 410 through a load board (not shown) to obtain high speed signals and power. The primitive 410 contains test circuitry for performing a test plan on the DUTs 420. The primitive 410 can operate independently of any other primitive and is connected to a control server.

Embodiments of the present invention utilize a plurality of primitives (similar to the primitive shown in FIG. 2) and associated DIBs to test the DUTs. Each primitive is modular meaning that it is capable of operating independently from other primitives. Therefore, a plurality of primitives set in a rack can each be operating under a different test plan.

As explained in U.S. patent application Ser. No. 15/455,103, filed Mar. 9, 2017, entitled "DEVICE TESTING USING DUAL-FAN COOLING WITH AMBIENT AIR," (referred to herein as the "Dual-Fan Cooling Application") which is incorporated by reference herein, in one embodiment, if the test system uses the primitives shown in FIG. 4, the environmental chamber is no longer needed when testing DUTs associated with a rack of primitives because the primitives are designed to be partitioned in an efficient way.

As noted in the Dual-Fan Cooling Application, the advantage of the dual-fan cooling with ambient air system is that the ambient air is efficiently and successfully implemented to cool the DUTs (devices under test) without needing additional cooling elements, aside from the fans. The need for an environmental chamber is eliminated using the primitives shown in FIG. 4 as heat generated from the DUTs themselves is used to reach the testing temperature set point. The fans then maintain that set point. Further, dual-fan cooling with ambient air is low cost, compatible with robotic DUT (device under test) manipulation and well suited for volume testing of different types of devices (or DUTs) as indicated above.

In this embodiment, the enclosure 450 of FIG. 2 of the instant application for the primitive allows the heat from the DUTs to be retained inside the enclosure and, therefore, a separate heating chamber is not required. As a result, direct user manipulation is allowed with respect to the DUTs and the primitives at any time. In other words, the DUTs supply the heat (when powered up for longer durations within the enclosure) that is needed to test the DUTs at higher temperatures. Further, the fans and/or vents allow air to circulate inside the primitive to cool the DUTs and, consequently, lower the internal temperature of the primitive.

A typical test head comprises a plurality of primitives and associated DUT interface boards (DIBs) to test the DUTs. Each primitive is modular meaning that it is capable of operating independently from other primitives. Each primitive is connected to a DIB 400, wherein the DIB contains a plurality of slots for a plurality of DUTs 420. The testing module 410 is modularized and is capable of being inserted into a rack supporting a plurality of modules with communication and power signals carried from the back of the module to one or more central control computers or testing stations (not shown). The individual DUT testing primitives 410 and the DIBs 400 may be inserted into respective rack slots to create a rack of customizable columns and rows in an ambient air environment (e.g., a testing floor or lab), eliminating the need for an environmental testing chamber.

As detailed in the Dual-Fan Cooling Application, the primitive 410 is operable to perform the testing on DUTs 420 by communicating power, instructions, signals, data, test results, and/or information with the DUTs 420. The test execution module 410 includes processing, communication, and storage circuitry to conduct the test on the DUTs 420. Further, the primitive or test execution module 410 controls the cooling of the DUTs 420 by receiving input signals from temperature sensors in the vicinity of the DUTs 420 and by adjusting the rotational speeds of the appropriate bottom and top fans. Also, the test execution module 410 includes an air conduit 490 to release air flow from the DIB 400 into the surrounding environment.

Figure 3A:
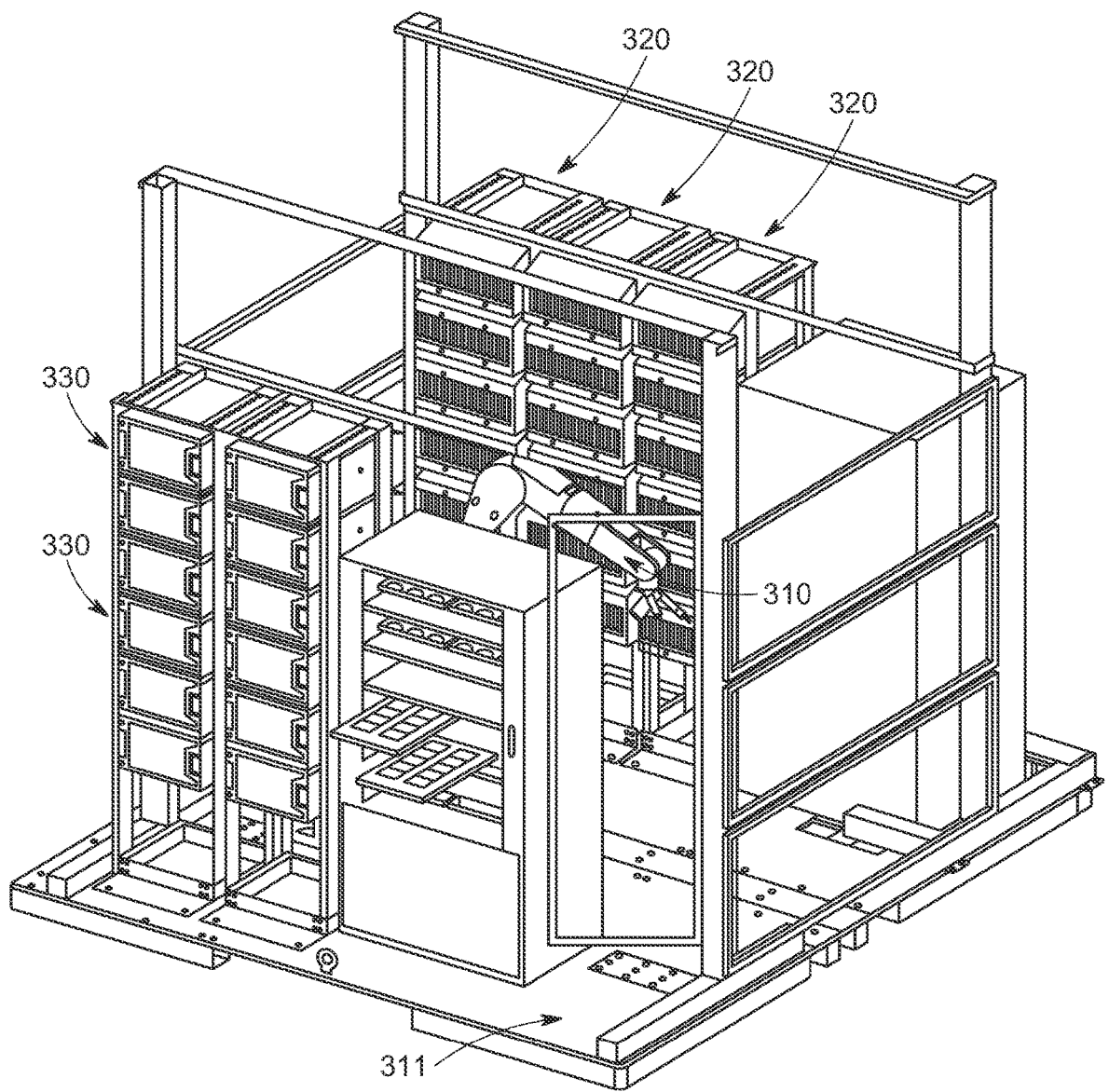
FIG. 3A illustrates an automated workcell using a six-axes industrial robot used to transfer DUT devices (e.g., Solid State Drives) into and out of the test primitives in the test head in accordance with an embodiment of the present invention.

FIG. 3A illustrates an automated workcell using a six-axes industrial robot used to transfer DUT devices (e.g., Solid State Drives) into and out of the test primitives in the test head in accordance with an embodiment of the present invention.

Industrial robots can have various axis configurations. Typically, most articulated robots feature six axes, also called six degrees of freedom. Six axis robots allow for greater flexibility and can perform a wider variety of applications than robots with fewer axes.

FIG. 3A illustrates a six-axis robot 310 that is used to transfer DUT devices (e.g., Solid State Drives) into and out of the test primitives during the performance and functional testing of the drives. FIG. 3 also shows the overall automation workcell comprising five racks 320 and six primitives 330 per rack. The robot 310 works at the center of the cell. Note, that while the illustration in FIG. 3A comprises five racks with six primitives per rack, the workcell can be scaled to include any number of racks and primitives and to many workcells onto a production floor. Accordingly, embodiments of the present invention advantageously achieve higher yield in less time by automating the insertion or removal of devices into the primitives. Further, the robots arm can reach higher than the average human and, accordingly, embodiments of the present invention allow the primitives in the workcell to be stacked higher than in a configuration using manual labor.

The automated workcell can also comprise a large aluminum plate 311 that is placed on the floor of the production floor and provides a single foundation for all of the hardware components. In one embodiment, the aluminum plate can comprise a 1 inch thick aluminum slab machined and drilled to accommodate bolt-down of the steel weldments and the test racks.

Figure 3B:
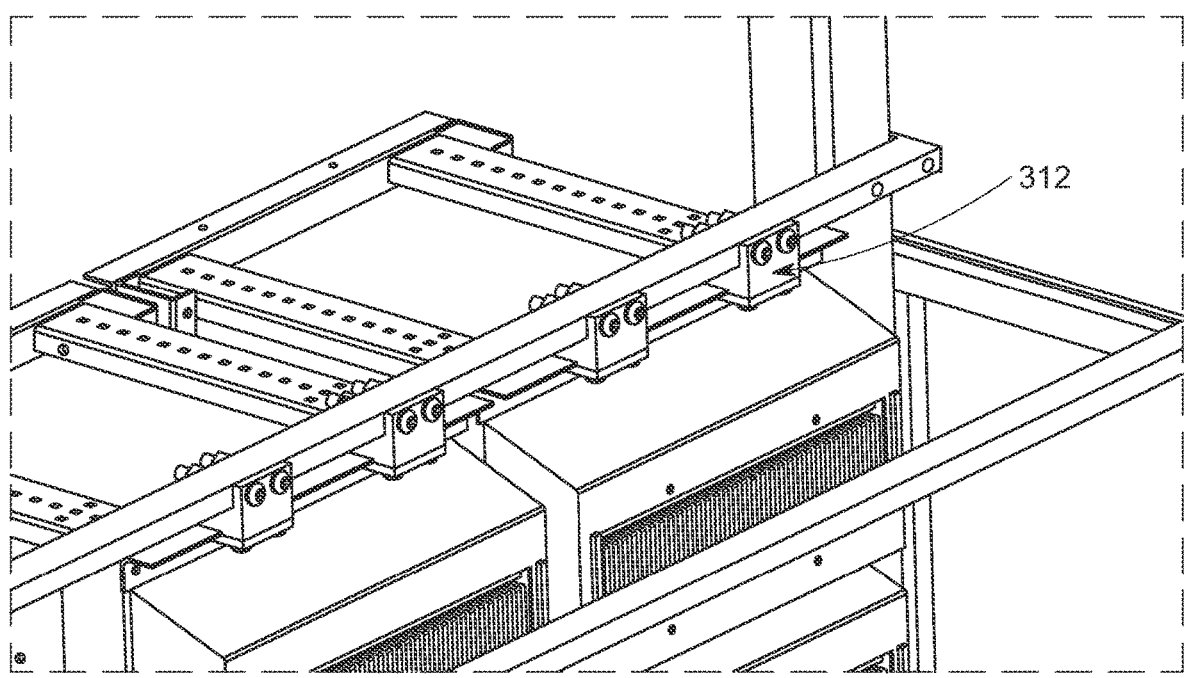
FIG. 3B illustrates the structural weldments used to hold the test racks into static positional alignment in a workcell in accordance with an embodiment of the present invention.

FIG. 3B illustrates the structural weldments used to hold the test racks into static positional alignment in a workcell in accordance with an embodiment of the present invention. In order for the racks to be immune to vibration or movement associated with the pushing and pulling of DUTs during placement or extraction from the tester slots, structural weldments 312 are used to hold the racks into static positional alignment, as shown in FIG. 3B. The structural weldments can be comprised of upright steel structural weldments that are securely anchored to the slab base plate 311. Each workcell also comprises crossbars that provide support for each of the racks in the cell.

Figure 3C:
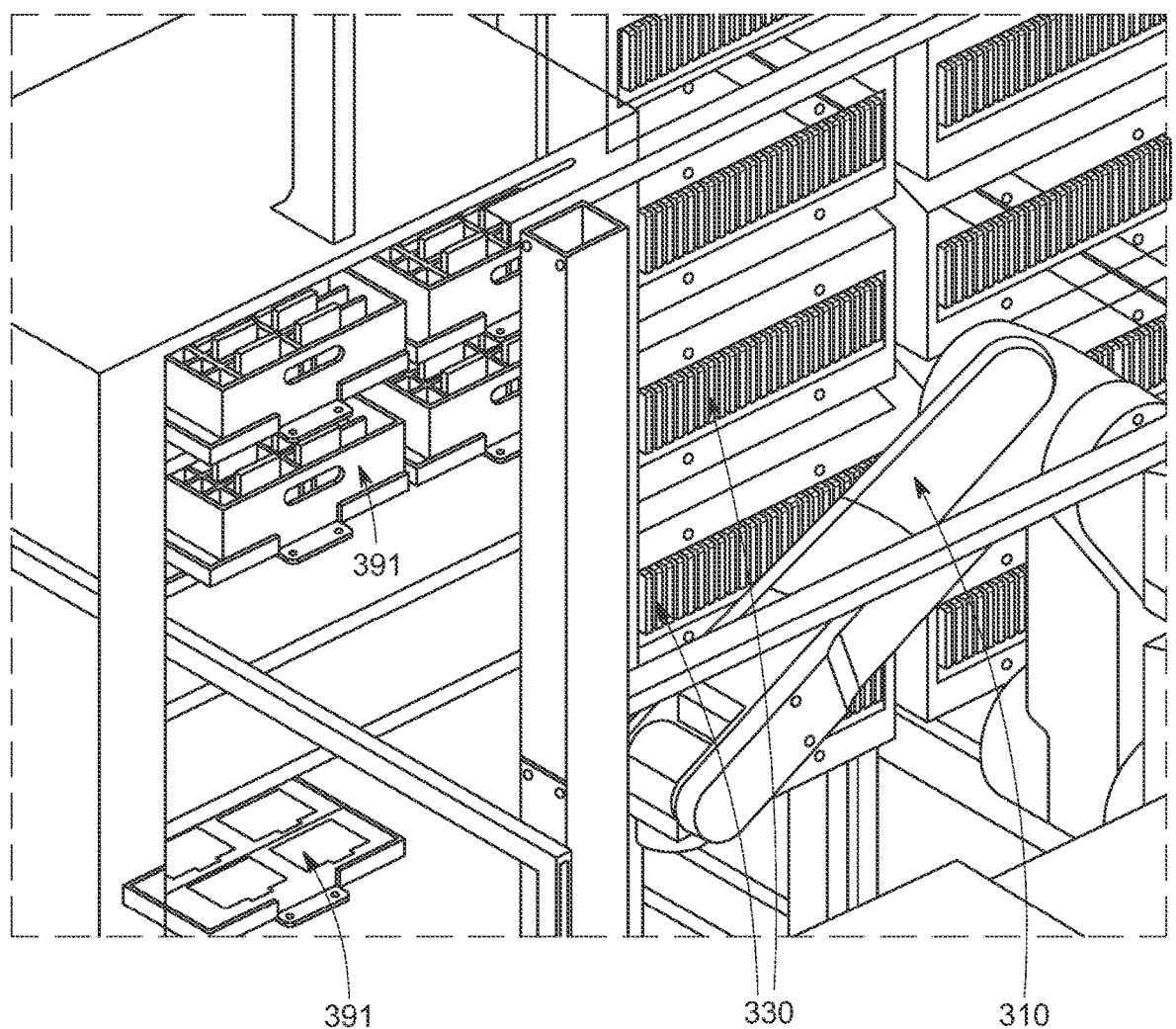
FIG. 3C illustrates an input and output module that are used to present the DUTs to the robotic arm during testing in accordance with an embodiment of the present invention.

FIG. 3C illustrates an input and output module that is used to present the DUTs to the robotic arm during testing in accordance with an embodiment of the present invention. The input and output module is a stand-alone system that provides for sliding trays/totes 391 that slide in from the operator's side, through the module, and out the other side to present the DUTs to the robot for pickup. Several slides can be programmed for various input or sort categories at any given time. In one embodiment, there is a display controlled by a micro-controller to show the operator what tote to load or unload. In operation, the operator places a tote or tray onto the slide that has been pushed out and presented to her. She then presses a flashing key button to allow the slide to move inwards into the module enclosure. On the opposite side, inside the work envelope of the robot, the slide with the tray or tote requiring access by the robot during that pick and place operation is slid out into the work envelope of the robot for access. Once the robot has picked up or placed a DUT, the slide moves backwards quickly again into the module cabinet. In this manner, only the slides required for access by the robot at a given moment are allowed to enter into the robot work envelope. As shown in FIG. 3C, the input output module can be situated next to test racks with their primitives 330 filled with DUTs (e.g., SATA SSDs). This input output module uses double ended drawer slides driven by a stepper motor at each station linked to a rack and pinion to slide the table surface out towards the operator, or inwards into the robot work envelope.

FIG. 4 illustrates an automated workcell using a Cartesian three-axes industrial robot used to transfer DUT devices (e.g., Solid State Drives) into and out of the test primitives in the test head in accordance with an embodiment of the present invention. The workcell of FIG. 4 comprises a single rack 497 with five primitives 496.

The cartesian coordinate robot (also called linear robot) 495 shown in FIG. 4 is an industrial robot whose three principal axes of control are linear (e.g. they move in a straight line rather than rotate) and are aligned at right angles to each other. The three sliding joints correspond to moving the wrist up-down, in-out, and back-forth. In certain production environments requiring a low-cost workcell, it may be used as an alternate to the six-axes robot. The Cartesian robot 495 can be programmed to retrieve DUTs from tray 498 and move along the 3 linear axes (x, y, and z) to transfer the DUTs into the slots of the DIBs associated with primitives 496.

Figure 5:
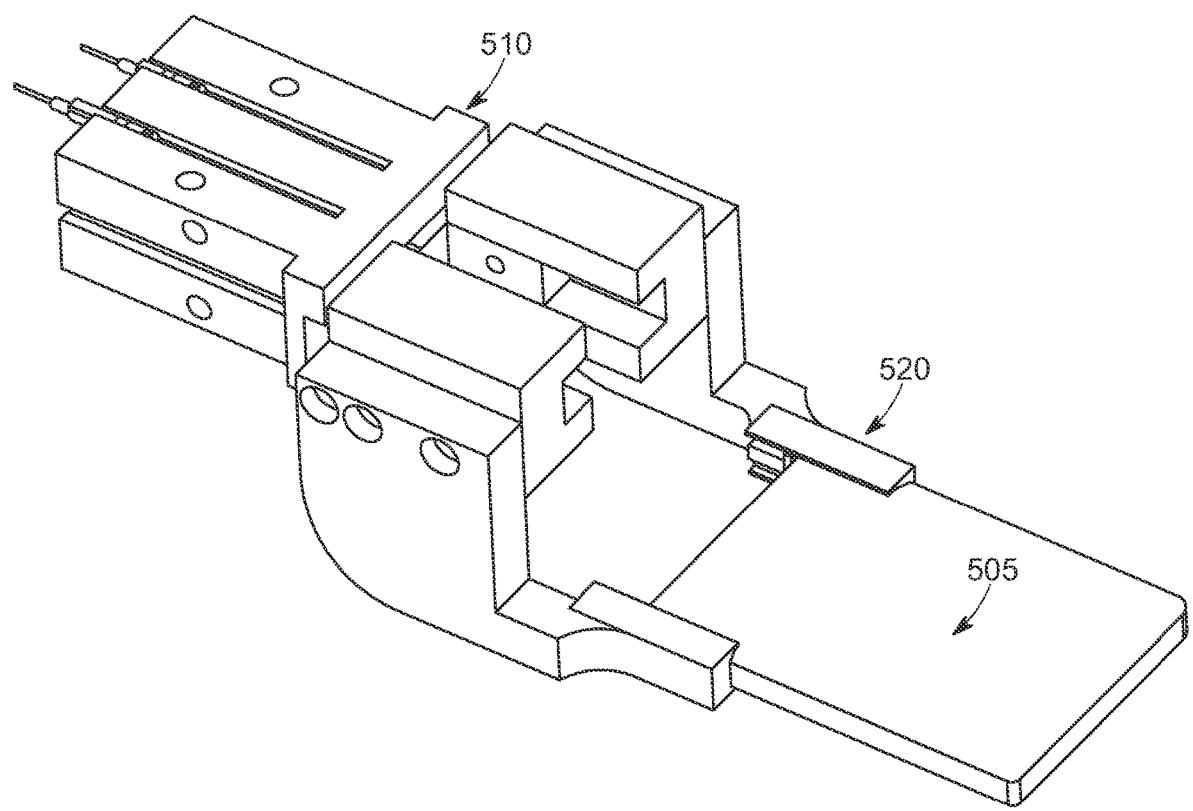
FIG. 5 illustrates an end effector that is connected to the end of a robot arm and is used to grasp and transfer DUT devices (e.g., Solid State Drives) into and out of the test primitives in the test head in accordance with an embodiment of the present invention.

FIG. 5 illustrates an end effector that is connected to the end of a robot arm and is used to transfer DUT devices (e.g., Solid State Drives) into and out of the test primitives in the test head in accordance with an embodiment of the present invention. An end effector 510 is a device or tool that is connected to the end of a robot arm where the hand would be located. The end effector is the part of the robot that interacts with the DUTs 505. In other words, the end effector is the gripper that is used to grab the DUTs using the gripper fingers 520 and move them to and from the slots inside the primitive.

In one embodiment of the present invention, the robot arms (for both the six-axes and the Cartesian robot) have exchangeable grippers. The gripper used depends on the form factor of the device, e.g., a SATA 2.5, an M.2 drive, etc. The robot arm is programmed to approach a tray and pull one or more DUTs out of a tray using the gripper and, subsequently, slide the one or more DUTs into the test slots of the desired primitive. Different types of DUTs have different specifications and form factors and the grippers can be chosen to accommodate the difference in sizes, forms, and shapes. Also, the robot arms can be programmed so that the grippers can grab the DUTs at the desired location. For example, the robot arms can be programmed so that the grippers can grab the DUTs at a location and in a way that would be less likely to damage the DUTs.

In one embodiment, the gripper needs to have adequate strength and flexibility to detect the device format. Depending on the type of DUT being tested, the robot or tester can be programmed with the intelligence to recognize which gripper needs to be chosen, to select the appropriate device gripper and to pick up the DUT and insert it in the appropriate slot.

In another embodiment, the robot or tester is further programmed to use the gripper to determine the orientation of the DUT or the placement of the device within the tray. For example, the DUT can either be in a vertical or horizontal orientation within a tray. The robot or tester, in this embodiment, would be programmed to recognize what orientation the DUT is placed in within the tray and to pick up the device at the appropriate contact point based on the determined orientation. For example, the robot can be programmed so that the gripper accesses a DUT tray at locations where dents for human finger access exist to pick up the DUTs and further programmed so that the grippers grab the DUTs at the edges of the devices during insertion and extraction in-and-out of the primitive test slots.

Figure 6:
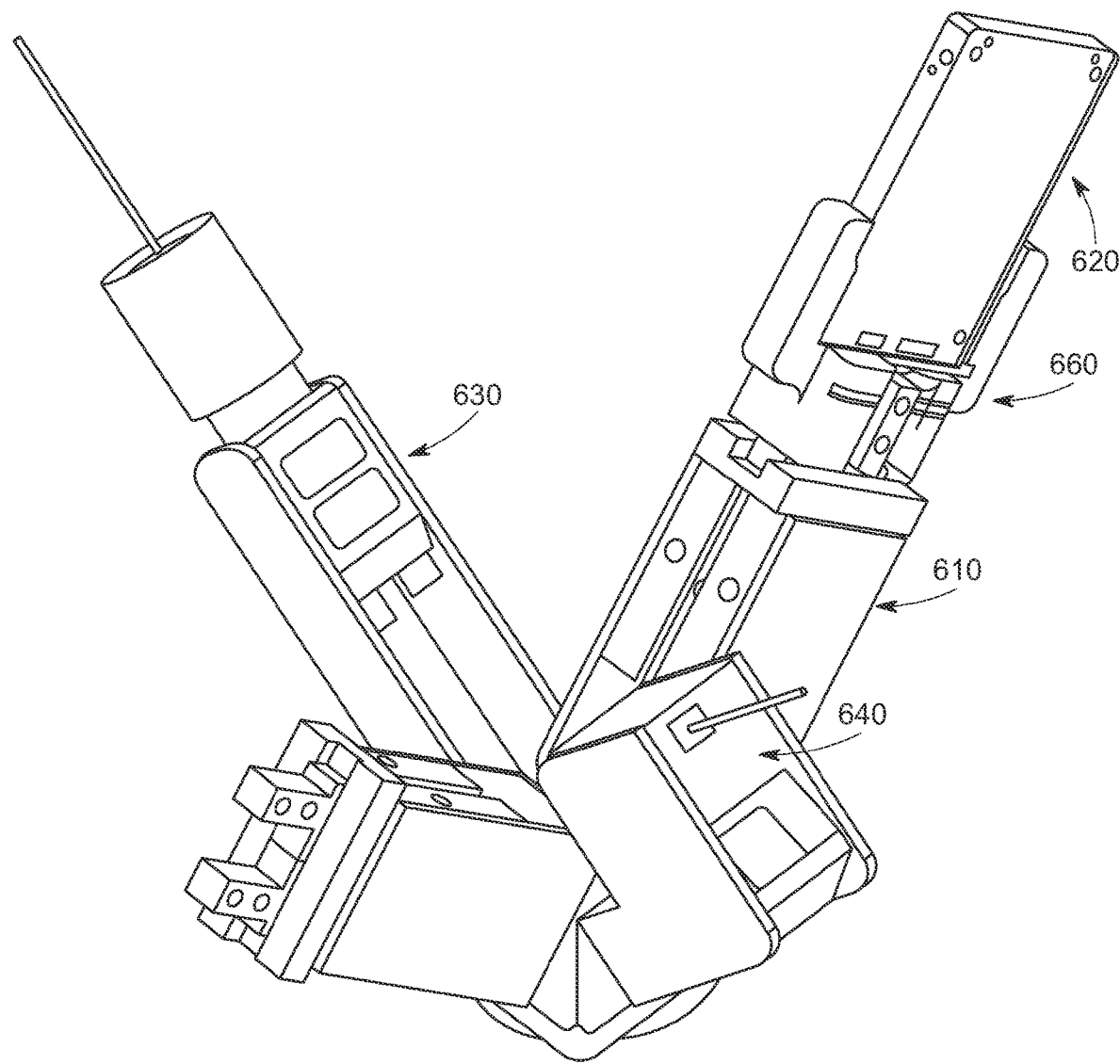
FIG. 6 illustrates another end effector that is connected to the end of a robot arm and is used to grasp and transfer DUT devices (e.g., Solid State Drives) into and out of the test primitives in the test head in accordance with an embodiment of the present invention.

FIG. 6 illustrates another end effector that is connected to the end of a robot arm and is used to transfer DUT devices (e.g., Solid State Drives) into and out of the test primitives in the test head in accordance with an embodiment of the present invention.

The end effector shown in FIG. 6 comprises a custom mechanical assembly that comprises the grippers 610 and also the instruments needed for operation in the workcell. The grippers can comprise positional sensors to detect motion, plus optical sensors to detect the presence of DUTs.

The end effector of FIG. 6, for example, comprises a laser transducer 630 for measuring the depth of movement. The transducer can also be used during automated positional reference calibration. Part of the robot orienting and mechanical registration feature is the ability to measure precisely the distance of the robot and effector from the primitives, so that the robot can use this for self-correction of positional references.

The end effector further comprises camera 640 this is used to allow proper placing of the grippers over the DUTs. The camera is used during pick up and placement of DUTs in and out of totes and trays to attain precision positional reference. It can also be used to read and decipher all serial numbers and barcodes from the DUT.

The grippers 610 move the gripper fingers 660 which hold the DUT 620 to be moved. The camera 640 can be used by the tester to grab the DUTs at precise contact points so as not to damage the DUTs. The tester has the intelligence to use predetermined reference points and the signal from the camera to pick up the DUTs without damaging the devices. Further, the camera 640 can also be used to determine the orientation and placement of the DUTs in the trays. The laser transducer 630 can also be used in concert with the camera for determining the manner in which the DUTs need to be picked out of the tray and for inserting and removing the DUTs from the slots in the primitives.

In one embodiment, the end effector is electronic, which allows the gripping power of the gripper fingers to be adjusted. The gripper fingers 660 can have custom gripping that allows the robot to pick up several different types and form factors of DUTs. The end effector's parallel grippers are, in a typical embodiment, designed to hold one DUT form factor at a time. In a different embodiment, the end effector is pneumatic. In one embodiment, the end effector can comprise pneumatic vacuum suction cups to be able to pick up DUTs that are lying flat in trays.

In one embodiment, the grippers can be designed to accept snap in and bolt down gripper fingers to accommodate different types of form factors. This entails the use of an automated gripper exchange mechanism, which allows the robot to insert the parallel robot gripper into an exchange station and the robot grippers for a particular product type can be exchanged for a different product type of gripper within a few seconds. As mentioned above, the tester can be programmed with the intelligence to determine the type of gripper required and to conduct this exchange without user intervention.

In one embodiment, the end effector is a dual end effector, capable of putting back a DUT currently in a gripper, and then immediately and quickly capturing another DUT in a similar gripper. The robot simply needs to twist its wrist 180° to direct the gripper at another DUT. This allows for almost double the throughput of a single gripper. In one embodiment, there is a series of 1 to 2 suction cups as part of the end effector which the robot can place onto a flat lying DUT in a flat plastic input tray. Once it obtains that DUT, it places it on to an interim stationary exchange station, twists its final robotic joints and again picks up the DUT using the grippers required for placement into and out of the primitives.

In one embodiment, a fixed and stable gripper exchange station is located on a steel post in front of the robot. The exchange station comprises the automated quick exchange mechanism and the various grippers needed to handle a particular product. In operation, the robot simply pushes the existing gripper into the station, and the gripper exchange mechanism captures the gripper and removes it from the pneumatic (or electric) parallel device. The robot then extracts the bare parallel gripper component and pushes it into a different exchange station to pick up the different product type gripper required for the next transfer. In one embodiment, the exchange station may also comprise a fixed mount barcode scanner that reads the DUT barcode labels when a DUT is stable inside a gripper. The robot is further capable of scanning the DUT as it passes over the barcode reader. In other words, while devices are being held at this station, the barcode scanner can read the serial number of the device either statically, or by having the robot scanned the device past the barcode scanner nonstop. In one embodiment, the DUTs already have the serial number stored internally in a RAM memory so the serial number can be read electronically (as opposed to using a barcode reader).

In one embodiment, the fixed exchange station has a number of devices to interface with the end effector, used primarily for transferring a DUT from a vacuum cup to a parallel gripper, and vice versa. The stationary exchange station also handles the removal of one type of product gripper, and the attachment of a different type of product gripper, all within a couple of seconds of robot motion.

Figure 7:
FIG. 7 illustrates solid state device (SSD) DUTs on a typical flat plastic tray used in a customer production facility.

FIG. 7 illustrates solid state device (SSD) DUTs on a typical flat plastic tray used in a customer production facility. The tray shown in FIG. 7 can be delicate and can easily bend and distort. It holds DUTs in the flat orientation. The robot of the present invention can advantageously be programmed to recognize the flat orientation of the DUTs and the end effector can use a vacuum cup to pick up the DUTs from the tray at locations that minimize the risk of damage to the DUTs.

Figure 8:
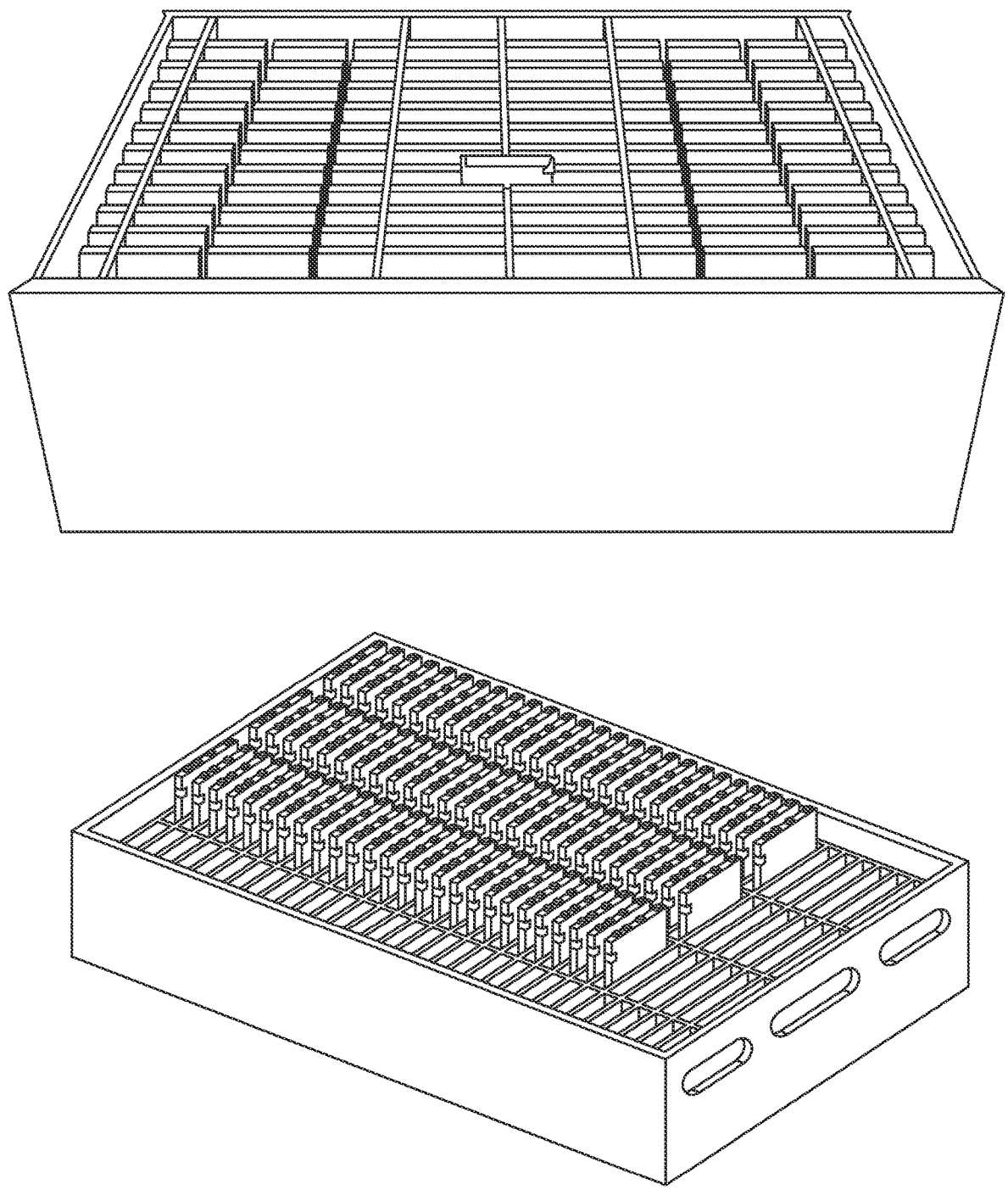
FIG. 8 illustrates solid state device (SSD) DUTs placed in a production floor tote.

FIG. 8 illustrates solid state device (SSD) DUTs placed in a production floor tote. These are composed of antistatic cardboard cartons or hard plastic. They will be partitioned to arrange the DUTs so the connectors are facing down, so the robot gripper has access to the end of the drive where contact is allowed on the corners.

The end effector shown in FIG. 6 is therefore able to perform a variety of functions. For example, the end effector can use a vacuum cup to pick up DUTs that are laying flat out of a tray or to place the same DUTs flat into an outgoing tray (as shown in FIG. 7). Further, the end effector can use the parallel grippers to capture devices that are standing vertically in tote slots (as shown in FIG. 8). Additionally, the end effector can use the parallel gripper to push a DUT into a primitive slot position or to grab and extract a DUT from the primitive. After picking up a DUT using a vacuum cup, for example, the end effector can place the DUT into a parallel gripper at the exchange station. While in the gripper at the exchange station, the bar code serial number can be read by the fixed barcode scanner at the exchange station.

Figure 9A:
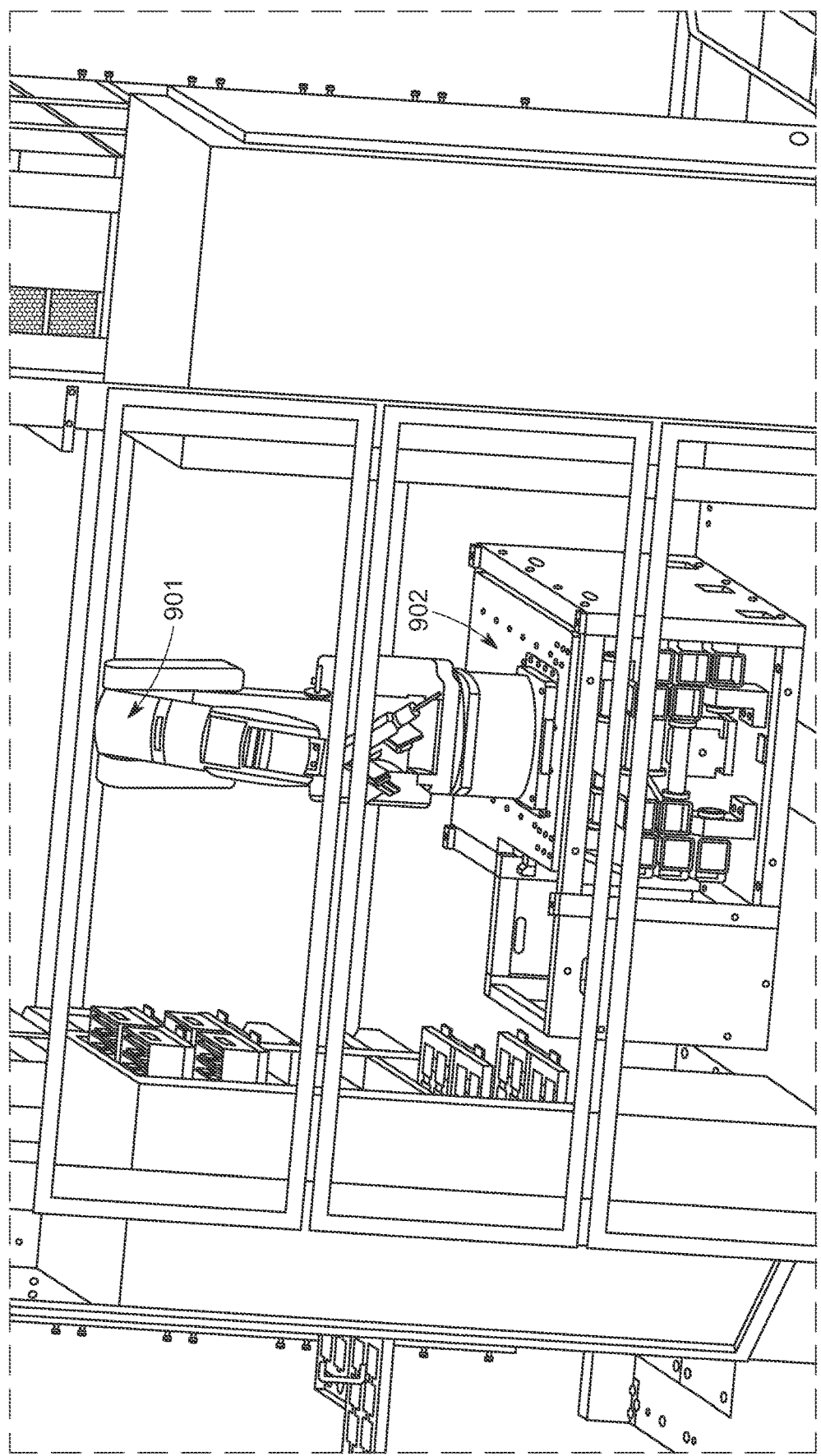
FIG. 9A illustrates a six-axes anthropomorphic industrial robot mounted to a height adjustable Z axis rectangular pedestal in accordance with an embodiment of the present invention.

FIG. 9A illustrates a six-axes anthropomorphic industrial robot mounted to a height adjustable Z axis rectangular pedestal in accordance with an embodiment of the present invention. To put the robot into the correct orientation relative to the items in the workcell, the robot 901 will be mounted to a rectangular pedestal that is actually a height adjustable Z axis motion device 902. The motion device 902 is comprised of a precision scissors lift with its own high torque stepper motor and associated electronics. The scissors lift is capable of transporting the entire robot upwards for accessing the higher optional rack heights. The six-axes robot 901 has a long reach and because it can be mounted on a height adjustable Z axis rectangular pedestal 902, the robot can advantageously access heights that a typical human operator may not be able to reach.

Figure 9B:
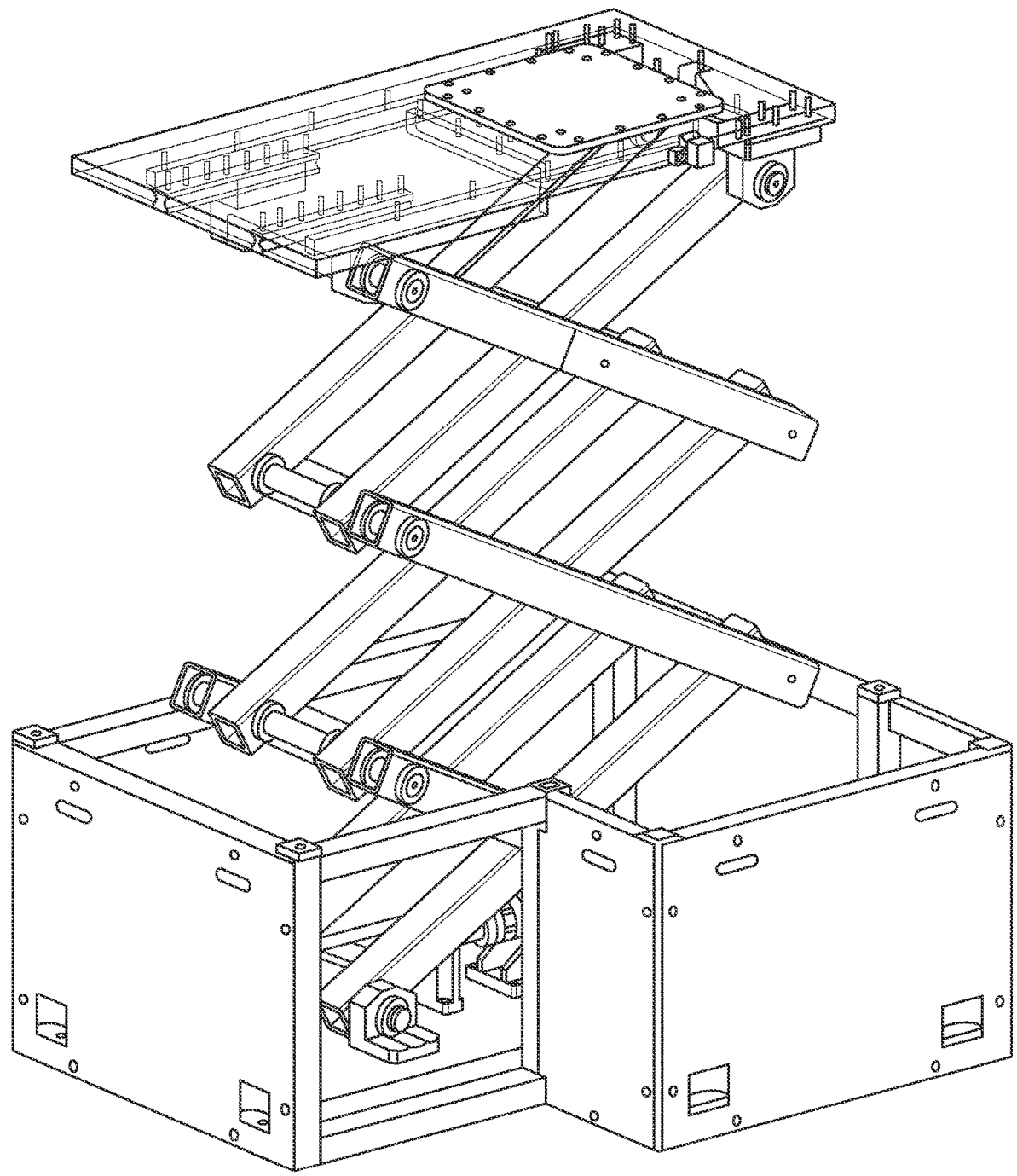
FIG. 9B illustrates the scissors lift module of the height adjustable Z axis rectangular pedestal in a fully extended upwards configuration in accordance with an embodiment of the present invention.

FIG. 9B illustrates the scissors lift module of the height adjustable Z axis rectangular pedestal in a fully extended upwards configuration in accordance with an embodiment of the present invention. The scissors lift can be heavy and is, therefore, comprised of its own steel weldment structure. The scissors lift module can have its own electronics built-in requiring mainly a power and an Ethernet connection. The scissors lift works as its own independent module. It simply carries the robot up and down to a designated position commanded by the system controller over local Ethernet. The scissors active action results from a high torque stepper motor driving a thick tight-pitch linear screw, able to handle the extremes in weight transfer required at the bottom of motion. Both the top and the bottom use linear slides to accommodate the required motion for the scissors action. There is a clutch and brake built into the stepper motor assembly to stop any downward creep or any motion whatsoever during loss of power, specifically when an emergency power off condition is required. There is an optical laser transducer that measures the height of the scissors platform relative to the base to verify the required motion has been achieved. The electronics for the lift consists of a fanless Windows-based embedded PC along with a stepper motor indexer.

Figure 10A:
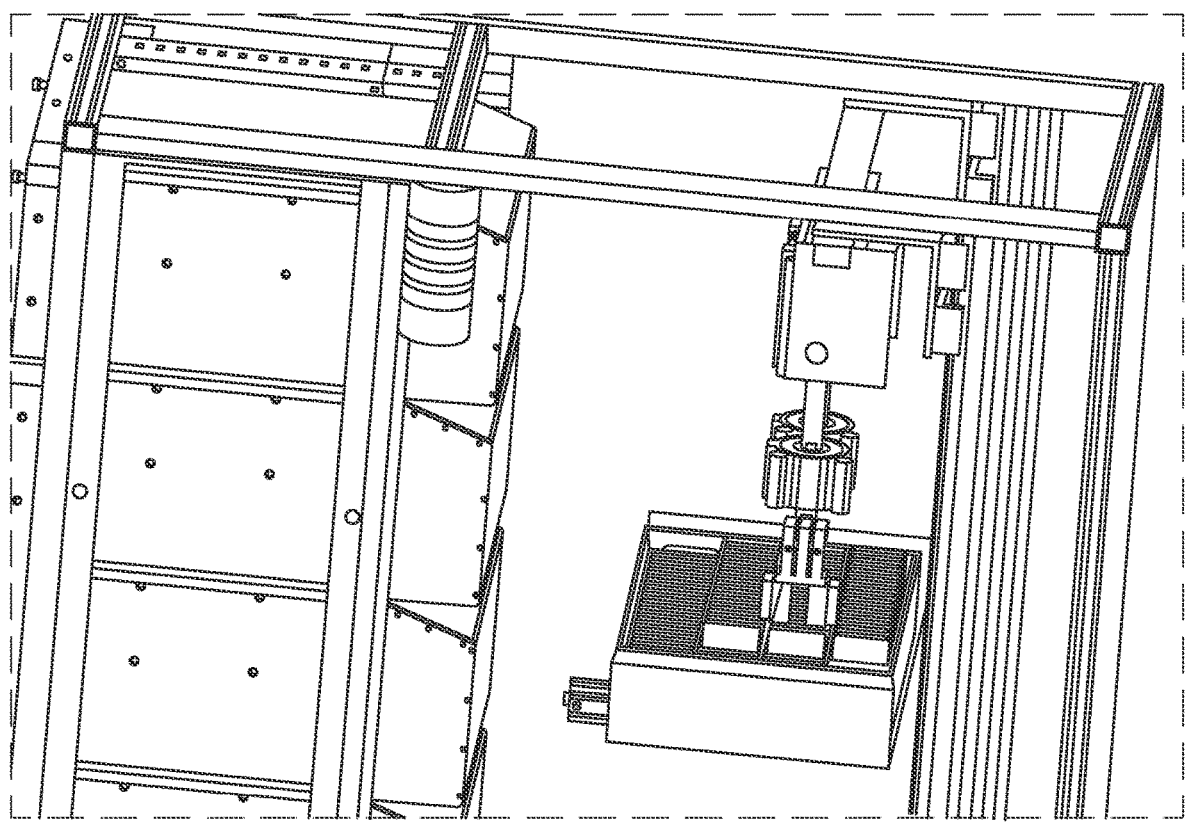
FIGS. 10A, 10B, 10C, 10D and 10E illustrate the manner in which a Cartesian robot retrieves DUTs from a tray and inserts the DUTs into the slots of the primitives in accordance with an embodiment of the present invention.

FIGS. 10A to 10E illustrate the manner in which a Cartesian robot retrieves DUTs from a tray and inserts the DUTs into the slots of the primitives under computer control in accordance with an embodiment of the present invention. FIG. 10A illustrates the Cartesian robot that moves in the x, y and z plane accessing DUTs that are arranged in a vertical orientation in a production floor tote. The robot will typically be programmed with the intelligence to determine the location of the tote and the orientation of the DUTs placed in it. In one embodiment, the location (e.g., the x, y and z coordinates) of the tote can be programmed into the tester. The DUTs, as mentioned above, will be positioned with the connectors are facing down, so the robot gripper has access to the end of the drive where contact is allowed on the corners.

Figure 10B:
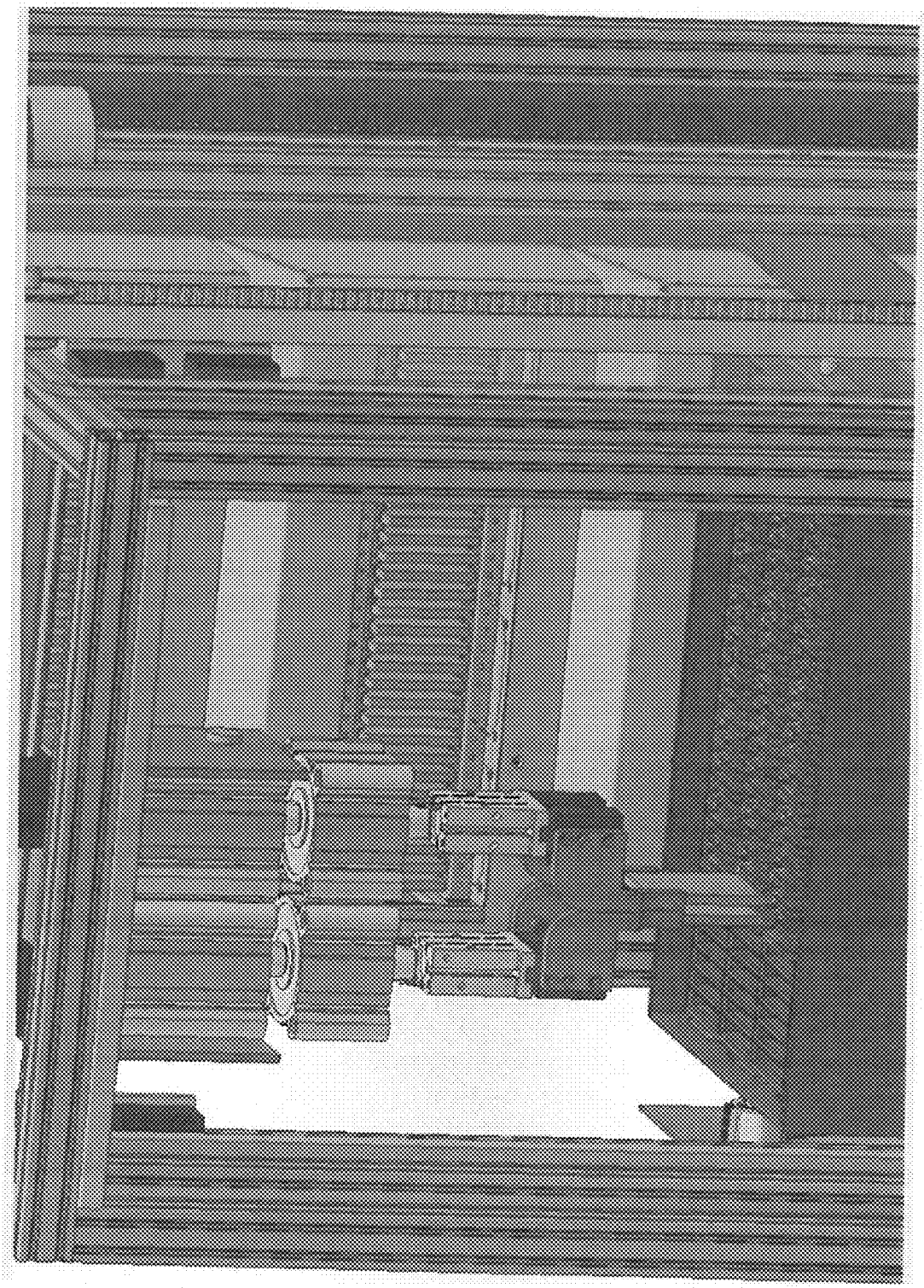
Figure 10C:
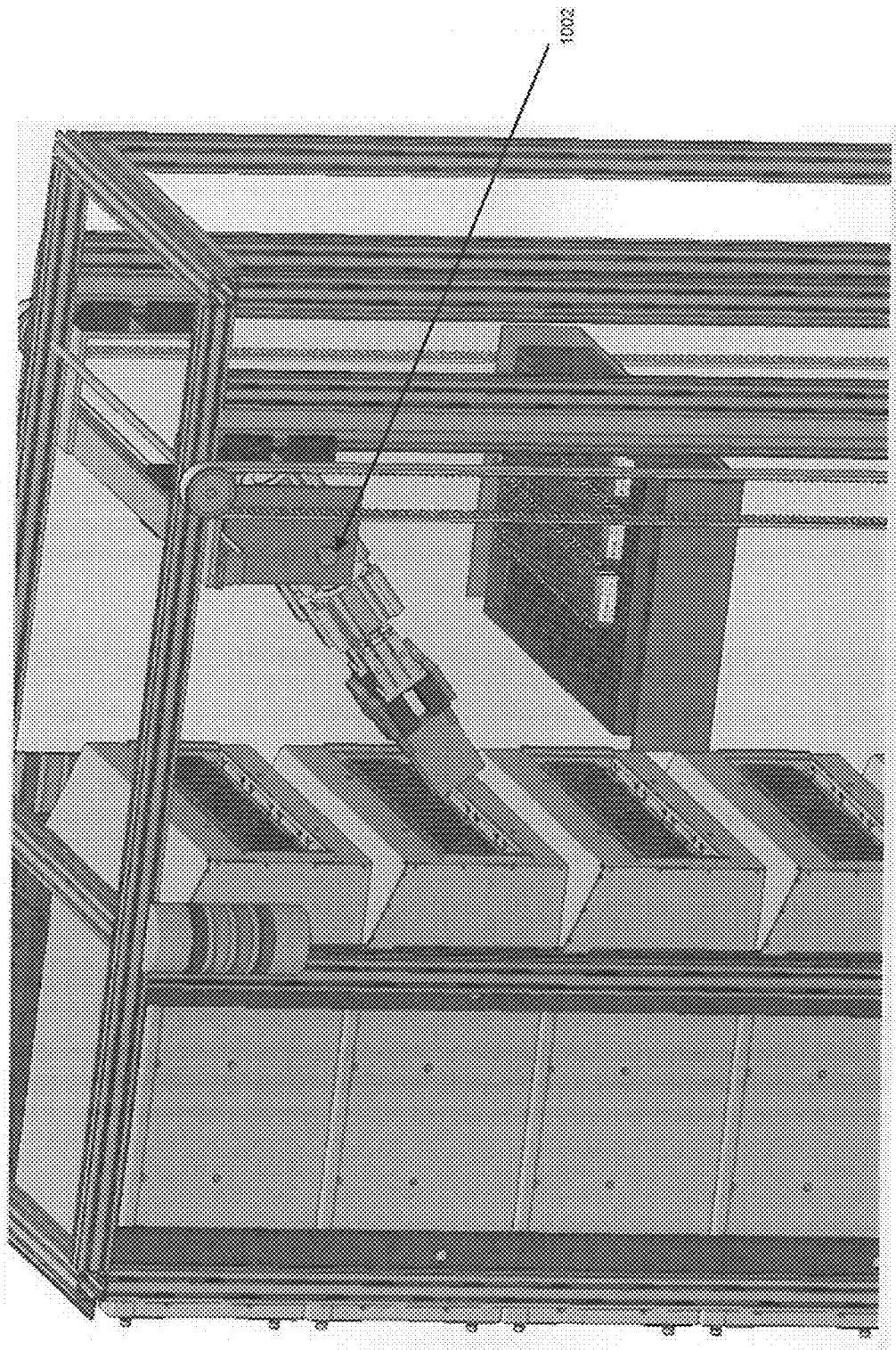
Figure 10D:
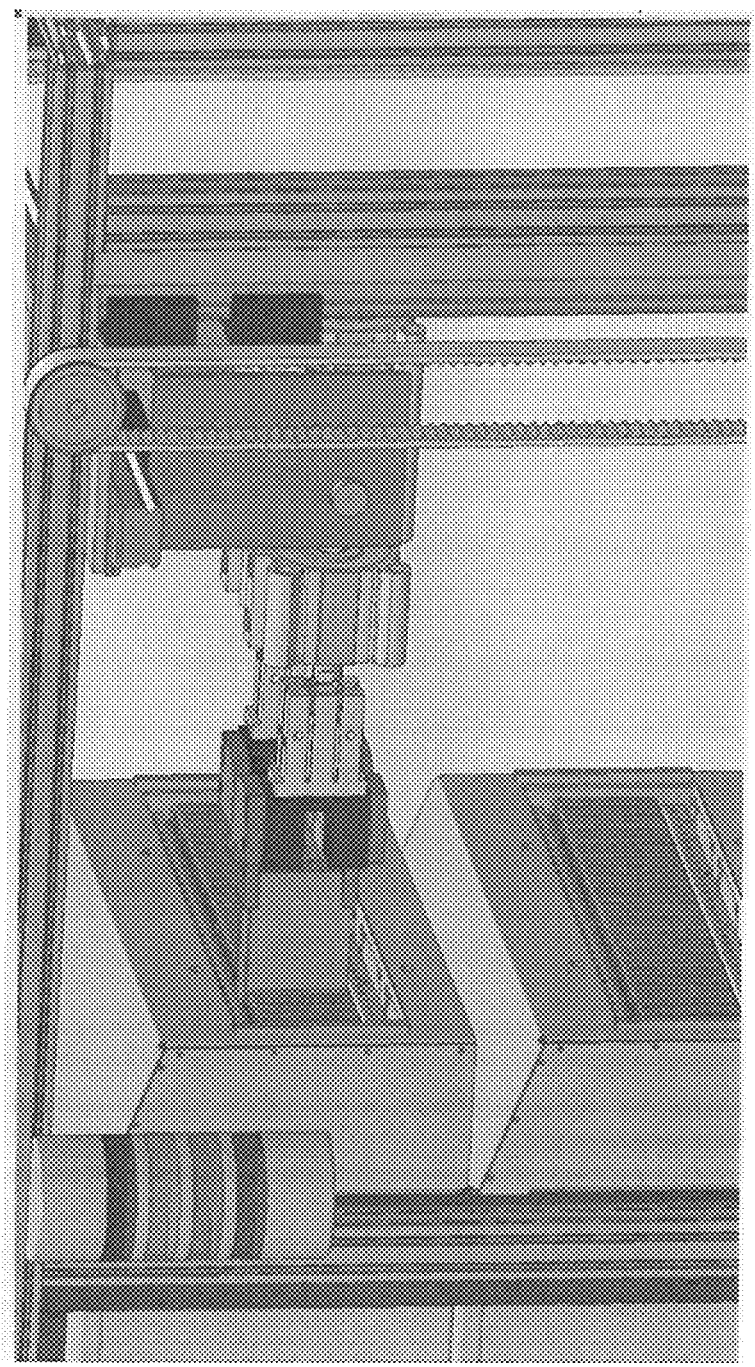
Figure 10E:
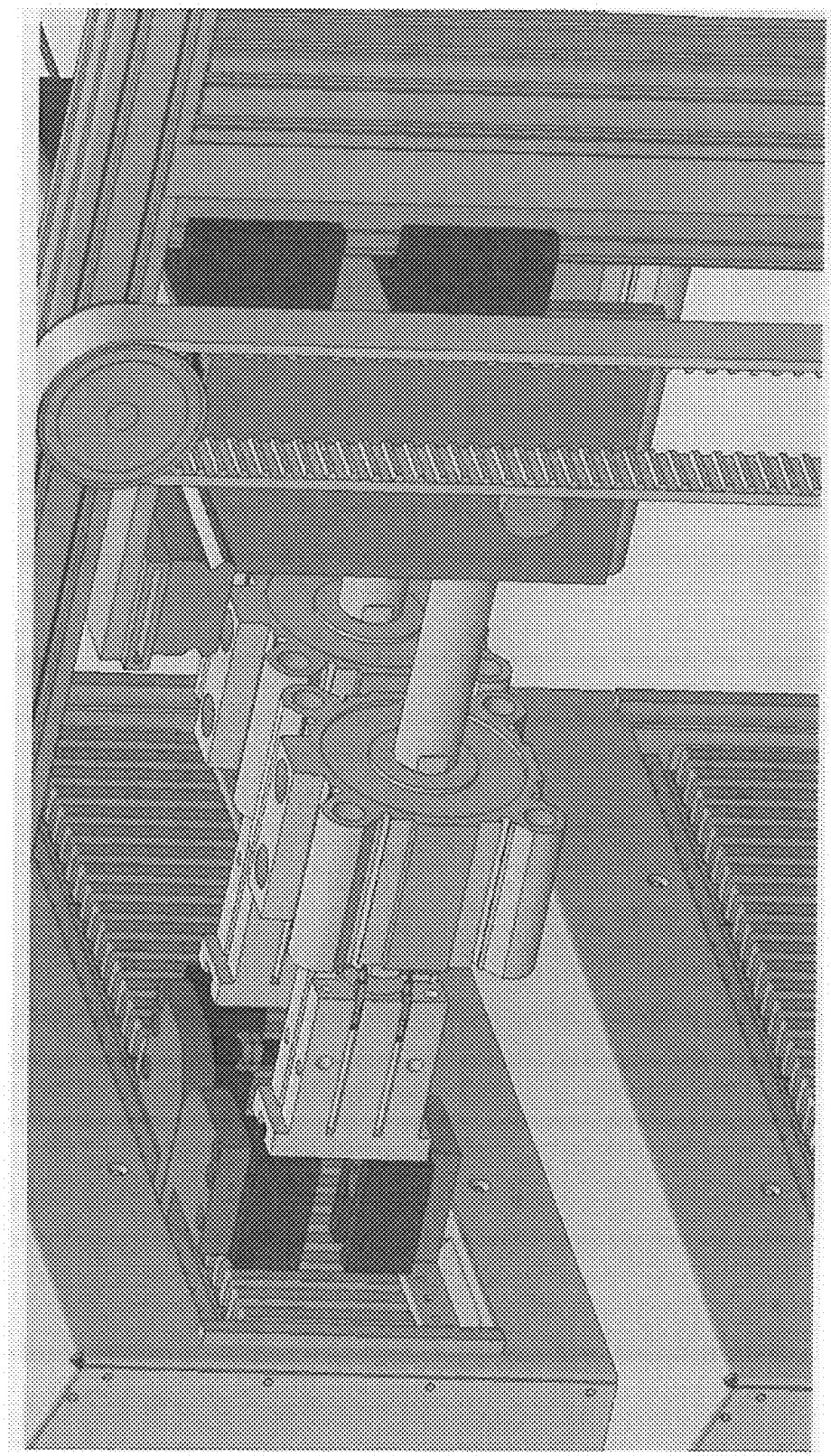

FIG. 10B illustrates the end effector accessing two DUTs in parallel using two parallel grippers. The robot can move up and down (in the z-direction) to access the tray and pick up two DUTs at a time. In one embodiment, each gripper is loaded at separate times. In a different embodiment, both the grippers can be loaded at the same time. FIG. 10C illustrates the Cartesian robot rotating around pivot point 1002 to allow the robot arm to move in the x-y plane in order to insert the DUTs into the primitive slots. Finally, FIGS. 10D and 10E illustrate the different views of the end effector inserting the two DUTs in open slots within the primitive.

Figure 11:
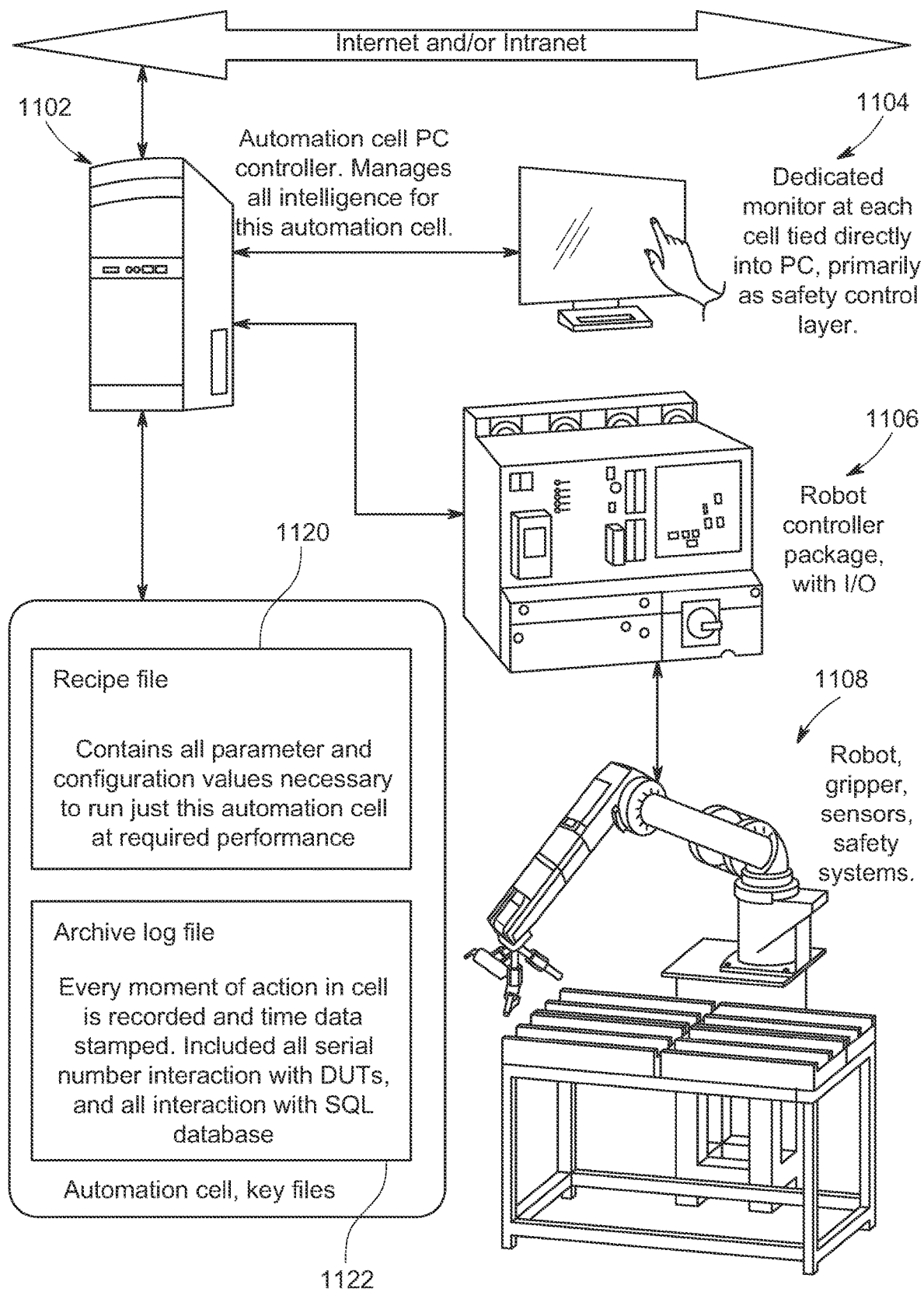
FIG. 11 illustrates the manner in which a workcell is controlled from a PC controller in accordance with an embodiment of the present invention.

FIG. 11 illustrates the manner in which a workcell is controlled from a PC controller in accordance with an embodiment of the present invention. In one embodiment, a system controller 1102, which can be a standard PC, can be configured to manage and execute all the operations within the entire workcell. In one embodiment, a dedicated monitor 1104 at each cell can be used to interact with the system controller 1102. In one embodiment, the touchscreen monitor 1104 is used for observing and controlling the direct operation of the automation, and is useful for debugging or further programming for ongoing enhancements.

The system controller determines where all of the DUTs are currently, prioritizes and optimizes pick and place conditions, then sends those direction commands to the robot controller 1106, which controls the robot and gripper 1108. After the robot controller executes motion, and sensors verify the motion was completed successfully, it sends its newly updated position and status information to a SQL database over a network.

In one embodiment, the SQL database is configured to receive SQL commands and queries from the robot controller or the primitives. It is formatted into a series of tables that represent each of the primitives, the racks, and all of the tester socket locations. That information is filled with its current status or presence of DUTs, appropriate serial number and test results information, and any other information that the factory floor can use to determine current conditions. The SQL database provides the main interface for allowing the primitives to understand what the robot is accomplishing at the moment, and the status of every DUT on the factory floor. The robot test cell automation puts data into this database about the current conditions in the robot test cell, and reads out information that had been placed there by primitives during their operations. It allows for fully asynchronous and independent communication between all items on the factory floor.

As shown in FIG. 11, in one embodiment, the system controller comprises a recipe file 1120 that contains all the parameter and configuration values necessary to run the workcell with the required performance. Further, the system controller also comprises an archive log file 1122 that contains a record of every action in the workcell. Each action is recorded and time-stamped. Further, the log file includes all serial number interaction with the DUTs and all the interactions with the SQL database.

Figure 12:
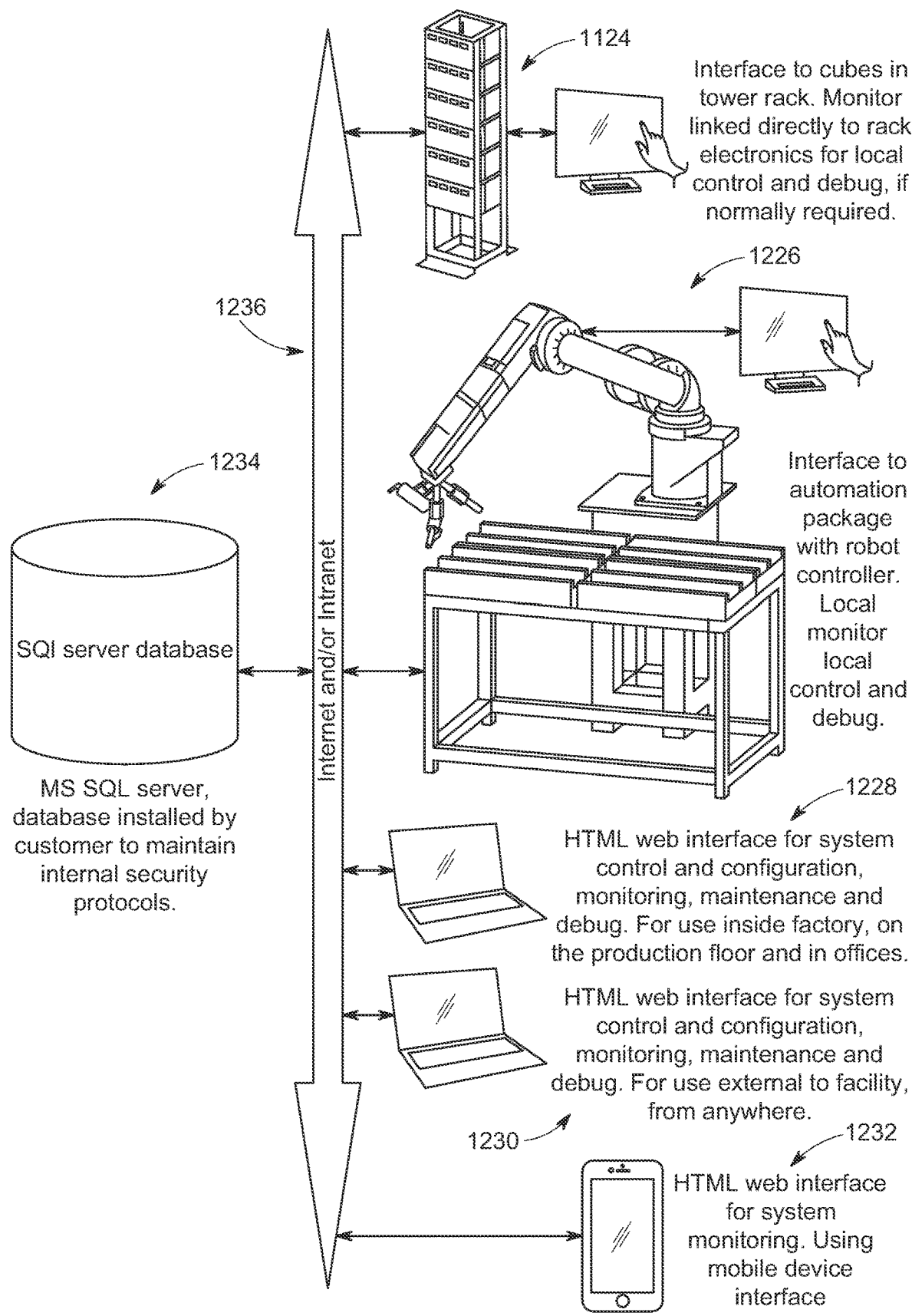
FIG. 12 illustrates the overall hardware and software required for the operation of the workcell in accordance with an embodiment of the present invention.

FIG. 12 illustrates the overall hardware and software required for the operation of the workcell in accordance with an embodiment of the present invention. The system controller 1102 and monitor 1104 can be used to interface with the primitives in the racks. The monitor and system controller can be linked directly to rack electronics for local control and debug. The monitor can comprise an interface 1124 that allows a user to interact directly with the primitives in the rack.

Further, the monitor 1104 can comprise an interface 1226 that to the automation package with the robot controller 1106. Further, the monitor can also provide control and debug capabilities. The monitor can also comprise an HTML web interface 1228 for system control and configuration, monitoring, maintenance and debug. This interface would typically be used on the production floor and inside the factory and the operations can be conducted over a local Intranet 1236.

The monitor can further comprise an HTML interface 1230 for system control and configuration, monitoring, maintenance and debug that can be used external to the facility where the user can log in from a remote location to conduct operations on the workcell over the Internet 1236. The monitor may also comprise an HTML web interface 1232 for system monitoring that runs on a mobile device.

The SQL database 1234 discussed above is installed by the customer and can be used to maintain internal security protocols at the customer's test site.

Figure 13:
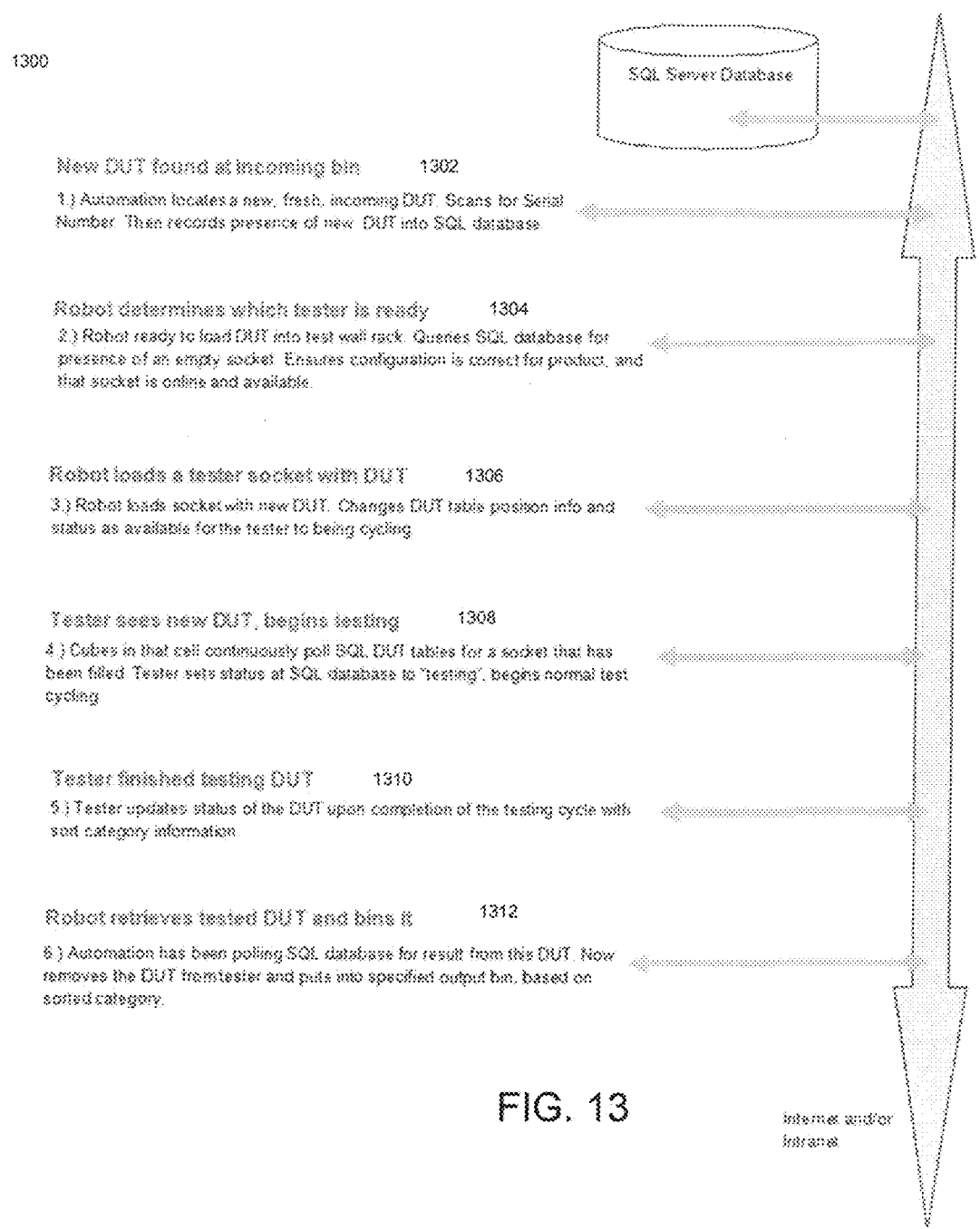
FIG. 13 illustrates a flowchart of an exemplary computer implemented process for running a test on a DUT within the workcell in accordance with one embodiment of the present invention.

FIG. 13 illustrates a flowchart of an exemplary computer implemented process for running a test on a DUT within the workcell in accordance with one embodiment of the present invention. The invention, however, is not limited to the description provided by flowchart 1300. Rather, it will be apparent to persons skilled in the relevant art(s) from the teachings provided herein that other functional flows are within the scope and spirit of the present invention. Flowchart 1300 will be described with continued reference to exemplary embodiments described above, though the method is not limited to those embodiments.

At step 1302, the automated test system locates an incoming DUT and records the presence of the new DUT in an SQL database. In one embodiment, the serial number for the DUT can be scanned at the exchange station.

At step 1304, the robot prepares to load the DUT into the test rack. The automated test system queries the SQL database to determine if an empty slot is available inside a primitive. Further, the automated system ensures that the configuration is correct of the tester is correct for the particular product being tested and that the chosen slot is online and available.

At step 1306, the robot loads the DUT into the chosen slot. Further, the test system changes the DUT table position info and its status to available in the SQL database for the tester to begin the testing process.

At step 1308, the primitives in the rack continuously poll the SQL DUT tables to determine if a socket has been filled. If a socket is filled, the tester sets the status at the SQL database to "testing" and begins normal test cycling.

At step 1310, the tester updates the status of the DUT upon completion of the testing cycle in the SQL database with Pass/Fail and other information, e.g., sort category.

At step 1312, the automated test system polls the SQL database to receive testing results for the DUT. Once the tester receives a response, it can remove the DUT from the primitive and put it into the specified output bin based on the received information, e.g., information regarding sorted category.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method for performing tests using automated test equipment (ATE), the method comprising:
   locating and grasping a device under test (DUT) to be tested;
   recording a presence of the DUT in a database;
   querying the database to determine if an empty slot is present in a device interface board (DIB), wherein the DIB comprises a plurality of slots for testing a plurality of DUTs, and wherein the DIB is associated with a primitive comprising test circuitry for performing a test plan on the DUT, and wherein the primitive comprises an enclosure and operates independently from other primitives in the ATE;
   using a robot to automatically position and insert the DUT in the empty slot;
   reporting to the database that the empty slot has been filled; and
   initiating testing on the DUT.

2. The method of claim 1, wherein the DUT is a solid state drive (SSD).

3. The method of claim 1, wherein the primitive is one of a plurality of primitives in a test rack, wherein the robot is operable to access slots in the plurality of primitives within the test rack.

4. The method of claim 1, further comprising:
   updating a status of the DUT in the database based on a result of the testing.

5. The method of claim 4, further comprising:
   using the robot to automatically retrieve the DUT from the primitive and return the DUT to a tray.

6. The method of claim 1, wherein the robot is a six-axes robot.

7. The method of claim 1, wherein the robot is a Cartesian robot.

8. The method of claim 1, wherein the robot comprises an end effector operable to hold and transfer the DUT in-and-out of a test slot in the primitive.

9. The method of claim 8, wherein the robot further comprises a camera operable to facilitate accurate pick up and placement of the DUT.

10. The method of claim 9, wherein the robot further comprises a laser transducer operable to measure a depth of movement of the end effector.

11. A system for performing tests using automated test equipment (ATE), the system comprising:
    a robot comprising an end effector operable to automatically pick up and transfer a Device Under Test (DUT) in-and-out of a test slot in a device interface board (DIB) within a primitive;
    a system controller comprising a memory and a processor for controlling the robot; and
    a test rack comprising a plurality of primitives, wherein each primitive is a modular device comprising a DIB, wherein the DIB comprises a plurality of slots for testing a plurality of DUTs, and wherein the robot is configured to automatically access slots in a respective DIB associated with each of the plurality of primitives within the test rack using the end effector, wherein each primitive of the plurality of primitives comprises test circuitry for performing a test plan on the DUT, and wherein each primitive of the plurality of primitives comprises an enclosure and operates independently from other primitives in the plurality of primitives.

12. The system of claim 11, wherein the robot further comprises a camera operable to facilitate accurate pick up and placement of the DUT.

13. The system of claim 12, wherein the robot further comprises a laser transducer operable to measure a depth of movement of the end effector.

14. The system of claim 11, wherein the robot is a six-axes robot.

15. The system of claim 11, wherein the robot is a Cartesian robot.

16. The system of claim 11, further comprising:
    a monitor coupled to the system controller, wherein the monitor is used to observe and control operation of the robot and for debugging problems with the robot.

17. The system of claim 11, further comprising:
    an exchange station comprising a plurality of end effectors, wherein the robot is operable to be programmed to automatically recognize a form factor of the DUT and to exchange end effectors at the exchange station depending on the form factor of the DUT.

18. A system for performing tests using automated test equipment (ATE), the system comprising:
- a robot comprising an end effector operable to automatically grasp and pick up and transfer a Device Under Test (DUT) in-and-out of a test slot in a device interface board (DIB) within a primitive;
- an input and output module comprising a plurality of trays and operable to present DUTs from the plurality of trays to the robot during testing;
- a system controller comprising a memory and a processor for controlling the robot; and
- a test rack comprising a plurality of primitives, wherein each primitive is a modular device comprising a DIB, wherein the DIB comprises a plurality of slots for testing a plurality of DUTs, and wherein the robot is configured to access slots in a respective DIB associated with each of the plurality of primitives within the test rack, wherein each primitive of the plurality of primitives comprises test circuitry for performing a test plan on the DUT, and wherein each primitive of the plurality of primitives comprises an enclosure and operates independently from other primitives in the plurality of primitives.

19. The system of claim 18, wherein the robot is operable to be programmed to automatically access the DUT directly from a tray in the input and output module prior to inserting the DUT in a slot within a designated primitive.

20. The system of claim 19, wherein the robot is further operable to be programmed to retrieve the DUT after a test has been run from the slot and return it to a tray in the input and output module.

21. The system of claim 18, wherein the robot further comprises a camera operable to facilitate accurate pick up and placement of the DUT.

22. The system of claim 21, wherein the robot further comprises a laser transducer operable to measure a depth of movement of the end effector.

23. The system of claim 22, wherein the robot further comprises a vacuum cup operable to pick up DUTs that are laying flat out of a tray or to place DUTs flat into an outgoing tray.

24. The system of claim 18, wherein the robot is a six-axes robot.

25. The system of claim 18, wherein the robot is a Cartesian robot.

26. The system of claim 18, wherein a plurality of structural weldments are operable to hold the test rack into static positional alignment in a workcell.

27. The system of claim 26, wherein the plurality of structural weldments secure the robot and the input and output module to the test rack.

* * * * *